(12) United States Patent
Bae et al.

(10) Patent No.: US 12,490,455 B2
(45) Date of Patent: Dec. 2, 2025

(54) SEMICONDUCTOR DEVICE

(71) Applicant: SAMSUNG ELECTRONICS CO., LTD., Suwon-si (KR)

(72) Inventors: Deok Han Bae, Suwon-si (KR); Myung Yoon Um, Suwon-si (KR); Yu Ri Lee, Suwon-si (KR); Sun Me Lim, Suwon-si (KR); Jun Su Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 289 days.

(21) Appl. No.: 17/989,944

(22) Filed: Nov. 18, 2022

(65) Prior Publication Data

US 2023/0352591 A1    Nov. 2, 2023

(30) Foreign Application Priority Data

May 2, 2022  (KR) .................. 10-2022-0054036

(51) Int. Cl.
*H10D 30/62* (2025.01)
*H01L 23/522* (2006.01)
*H01L 23/528* (2006.01)
*H10D 84/83* (2025.01)

(52) U.S. Cl.
CPC ..... *H10D 30/6211* (2025.01); *H01L 23/5226* (2013.01); *H01L 23/5283* (2013.01); *H10D 30/6219* (2025.01); *H10D 84/834* (2025.01)

(58) Field of Classification Search
CPC ............. H10D 30/6211; H10D 84/834; H10D 30/6219; H01L 23/5226; H01L 23/5283
See application file for complete search history.

(56) References Cited

U.S. PATENT DOCUMENTS

| | | | |
|---|---|---|---|
| 9,978,746 B2 | 5/2018 | Yeo et al. | |
| 10,522,423 B2 | 12/2019 | Liaw | |
| 10,770,589 B2 | 9/2020 | Cheng | |
| 10,910,376 B2 | 2/2021 | Park et al. | |
| 10,923,475 B2 | 2/2021 | Shin et al. | |
| 11,069,784 B2 | 7/2021 | Tsai et al. | |
| 2018/0102364 A1* | 4/2018 | Rastogi | H01L 21/76 |

(Continued)

OTHER PUBLICATIONS

European Search Report dated Sep. 27, 2023 for corresponding European Patent Application EP 23 160 782.1 (4 pages).

*Primary Examiner* — Christine A Enad
(74) *Attorney, Agent, or Firm* — Muir Patent Law, PLLC

(57) ABSTRACT

A semiconductor device includes an isolation structure having first and second sidewalls opposite each other, a first fin-shaped pattern in contact with the first sidewall and extending in the second direction, a second fin-shaped pattern in contact with the second sidewall and extending in the second direction, a first gate electrode on the first fin-shaped pattern, a first source/drain contact on the first and second fin-shaped patterns and extending between the first gate electrode and the element isolation structure, and a wiring structure on and connected to the first source/drain contact, wherein the first source/drain contact includes a lower contact intersecting the first and second fin-shaped patterns, an upper contact protruding from the lower contact, and a dummy contact, the wiring structure being in contact with the upper contact and not with the dummy contact.

20 Claims, 30 Drawing Sheets

(56) References Cited

U.S. PATENT DOCUMENTS

| | | | |
|---|---|---|---|
| 2019/0139891 A1* | 5/2019 | Ohtou | H01L 23/5286 |
| 2019/0393318 A1 | 12/2019 | Chung et al. | |
| 2020/0051976 A1 | 2/2020 | Ha et al. | |
| 2020/0075595 A1* | 3/2020 | Shin | H01L 21/76897 |
| 2021/0391464 A1* | 12/2021 | Bae | H10D 30/792 |
| 2022/0069092 A1* | 3/2022 | Min | H10D 84/85 |
| 2023/0053379 A1* | 2/2023 | Choi | H01L 23/5226 |

\* cited by examiner

SEMICONDUCTOR DEVICE

CROSS-REFERENCE TO RELATED APPLICATION

This application claims priority from Korean Patent Application No. 10-2022-0054036, filed on May 2, 2022, in the Korean Intellectual Property Office, and all the benefits accruing therefrom under 35 U.S.C. 119, the contents of which in its entirety are herein incorporated by reference.

BACKGROUND

1. Field

Embodiments relate to a semiconductor device.

2. Description of the Related Art

As one of scaling technologies for increasing the density of semiconductor devices, a multi gate transistor in which a multi-channel active pattern (or a silicon body) having a fin or nanowire shape is formed on a substrate and a gate is formed on a surface of the multi-channel active pattern has been proposed. Since such a multi gate transistor utilizes a three-dimensional channel, scaling is easily performed. Further, even if a gate length of the multi gate transistor is not increased, the current control capability may be improved. Furthermore, a SCE (short channel effect) in which potential of a channel region is influenced by a drain voltage may be effectively suppressed.

SUMMARY

According to an aspect of the present disclosure, there is provided a semiconductor device including an element isolation structure which includes a first sidewall and a second sidewall extending in a first direction, the first sidewall of the element isolation structure being opposite to the second sidewall of the element isolation structure in a second direction, a first fin-shaped pattern which is in contact with the first sidewall of the element isolation structure and extends in the second direction, a second fin-shaped pattern which is in contact with the second sidewall of the element isolation structure, spaced from the first fin-shaped pattern in the first direction, and extends in the second direction, a first gate electrode extending in the first direction and disposed on the first fin-shaped pattern, a first source/drain contact which is disposed on the first fin-shaped pattern and the second fin-shaped pattern between the first gate electrode and the element isolation structure, and extends in the first direction, and a wiring structure connected to the first source/drain contact and disposed on the first source/drain contact, wherein the first source/drain contact includes a first lower contact region intersecting the first fin-shaped pattern and the second fin-shaped pattern, a first upper contact region protruding from the first lower contact region, and a first dummy contact region, and the wiring structure is in contact with an upper surface of the first upper contact region and is not in contact with an upper surface of the first dummy contact region.

According to another aspect of the present disclosure, there is provided a semiconductor device including a first fin-shaped pattern extending in a first direction, a second fin-shaped pattern which is spaced apart from the first fin-shaped pattern in a second direction and extends in the first direction, a third fin-shaped pattern extending in the first direction, a fourth fin-shaped pattern which is spaced apart from the third fin-shaped pattern in a second direction and extends in the first direction, an element isolation structure which is in contact with the first fin-shaped pattern and the second fin-shaped pattern and extends in the second direction, a first gate electrode extending in the second direction and disposed on the first fin-shaped pattern, a second gate electrode extending in the second direction and disposed on the third fin-shaped pattern, a third gate electrode extending in the second direction and disposed on the fourth fin-shaped pattern, a first source/drain contact which is disposed on the first fin-shaped pattern and the second fin-shaped pattern between the first gate electrode and the element isolation structure, and extends in the second direction, a second source/drain contact which is disposed on the third and fourth fin-shaped patterns between the second and third gate electrodes, and extends in the second direction, and a wiring structure which is disposed on the first source/drain contact and the second source/drain contact and connected to the first source/drain contact and the second source/drain contact, wherein the first source/drain contact includes a first lower contact region intersecting the first fin-shaped pattern and the second fin-shaped pattern, and a first upper contact region protruding from the first lower contact region, the second source/drain contact includes a second lower contact region intersecting the third fin-shaped pattern and the fourth fin-shaped pattern, and a second upper contact region protruding from the second lower contact region, the wiring structure includes a via plug which is in contact with the first upper contact region and the second upper contact region, a bottom surface of the via plug has a via width in the second direction, a width of an upper surface of the first upper contact region in the second direction is greater than or equal to 1.5 times the via width, and a width of an upper surface of the second upper contact region in the second direction is smaller than or equal to 1.2 times the via width.

According to still another aspect of the present disclosure, there is provided a semiconductor device including a first fin-shaped pattern extending in a first direction, a second fin-shaped pattern which is spaced apart from the first fin-shaped pattern in a second direction and extends in the first direction, a third fin-shaped pattern which is spaced apart from the first fin-shaped pattern in the first direction and extends in the first direction, a fourth fin-shaped pattern which is spaced apart from the second fin-shaped pattern in the first direction and extends in the first direction, a first source/drain contact which is disposed on the first fin-shaped pattern and the second fin-shaped pattern and extends in the second direction, a second source/drain contact which is disposed on the third fin-shaped pattern and the fourth fin-shaped pattern and extends in the second direction, an element isolation structure which separates the first fin-shaped pattern and the third fin-shaped pattern from the second fin-shaped pattern and the fourth fin-shaped pattern and extends in the second direction, and a wiring structure which is disposed on the first source/drain contact and the second source/drain contact, and is connected to the first source/drain contact and the second source/drain contact, wherein the first source/drain contact includes a first lower contact region intersecting the first fin-shaped pattern and the second fin-shaped pattern, a first upper contact region protruding from the first lower contact region, and a first dummy contact region, the second source/drain contact includes a second lower contact region intersecting the third fin-shaped pattern and the fourth fin-shaped pattern, and a second upper contact region protruding from the second lower contact region, and the wiring structure is in contact with an upper surface of the first upper contact region and an upper surface of the second upper contact region, and is not in contact with an upper surface of the first dummy contact region.

BRIEF DESCRIPTION OF THE DRAWINGS

Features will become apparent to those of skill in the art by describing in detail exemplary embodiments with reference to the attached drawings, in which.

DETAILED DESCRIPTION

The drawings of a semiconductor device according to some embodiments show a fin-shaped transistor (FinFET) including a channel region of a fin-shaped pattern shape, a transistor including a nanowire or a nanosheet, and a MBCFET™ (Multi-Bridge Channel Field Effect Transistor) as an example. However, the semiconductor device according to embodiments may be applied to other transistors, e.g., a tunneling transistor (tunneling FET), a three-dimensional (3D) transistor, a planar transistor, a transistor based on a two-dimensional materials (2D material based FETs) and a heterostructure thereof, etc. Further, the semiconductor device according to some embodiments may also include a bipolar junction transistor, a laterally diffused metal oxide semiconductor (LDMOS), or the like.

Figure 1:
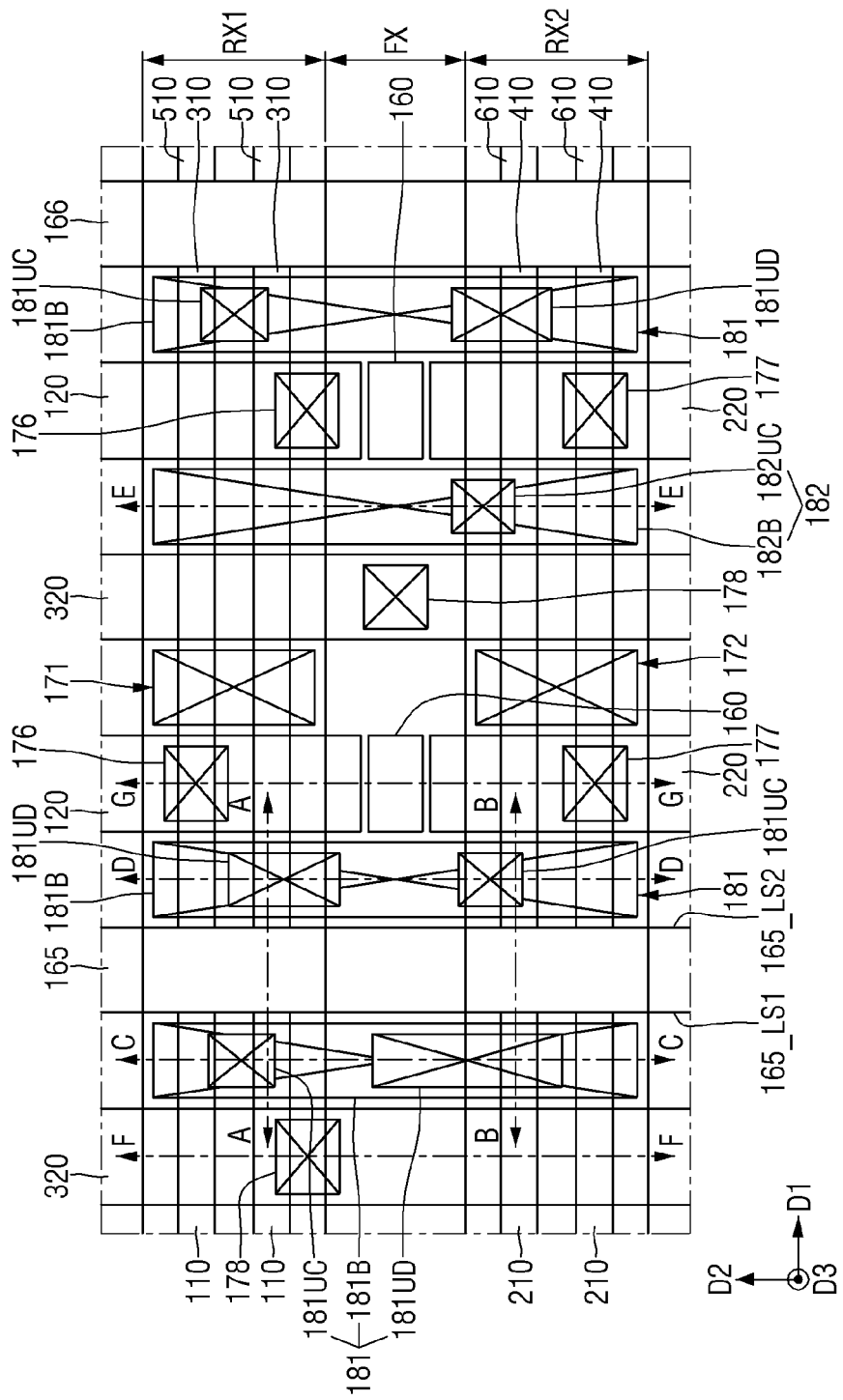
FIG. 1 is a layout diagram of a semiconductor device according to some embodiments.

FIG. 1 is an exemplary layout diagram for explaining a semiconductor device according to some embodiments. FIGS. 2 to 8 are cross-sectional views taken along lines A-A, B-B, C-C, D-D, E-E, F-F and G-G of FIG. 1, respectively. FIG. 9 is an enlarged view of portion P of FIG. 6. For convenience of explanation, FIG. 1 does not show interlayer insulating films 190, 191, and 192, a wiring structure 205, and the like.

Referring to FIGS. 1 to 9, a semiconductor device according to some embodiments may include first to sixth fin-shaped patterns 110, 210, 310, 410, 510 and 610, first to third gate electrodes 120, 220 and 320, first and second element isolation structures 165 and 166, a first source/drain contact 171, a second source/drain contact 172, first and second connecting source/drain contacts 181 and 182, and a gate isolation structure 160 on a substrate 100.

For example, the substrate 100 may be a bulk silicon substrate or an SOI (silicon-on-insulator). In another example, the substrate 100 may be a silicon substrate, and may include, e.g., silicon germanium, SGOI (silicon germanium on insulator), indium antimonide, lead tellurium compounds, indium arsenic, indium phosphide, gallium arsenide or gallium antimonide.

A first fin-shaped pattern 110, a third fin-shaped pattern 310, and a fifth fin-shaped pattern 510 may be disposed on the substrate 100. The first fin-shaped pattern 110, the third fin-shaped pattern 310, and the fifth fin-shaped pattern 510 may be formed in the first active region RX1 of the substrate 100. The first fin-shaped pattern 110, the third fin-shaped pattern 310, and the fifth fin-shaped pattern 510 may extend long, e.g., lengthwise, along a first direction D1. The first fin-shaped pattern 110, the third fin-shaped pattern 310, and the fifth fin-shaped pattern 510 may be aligned in a line along the first direction D1.

The first fin-shaped pattern 110 and the third fin-shaped pattern 310 may be defined by a fin trench FT extending in the first direction D1. The fin trench FT may define sidewalls of the first fin-shaped pattern 110 and the third fin-shaped pattern 310. The fifth fin-shaped pattern 510 may be defined by the fin trench FT.

A second fin-shaped pattern 210, a fourth fin-shaped pattern 410, and a sixth fin-shaped pattern 610 may be disposed on the substrate 100. The second fin-shaped pattern 210, the fourth fin-shaped pattern 410, and the sixth fin-shaped pattern 610 may be formed in the second active region RX2. The second fin-shaped pattern 210, the fourth fin-shaped pattern 410, and the sixth fin-shaped pattern 610 may extend long, e.g., lengthwise, along the first direction D1. The second fin-shaped pattern 210, the fourth fin-shaped pattern 410, and the sixth fin-shaped pattern 610 may be aligned in a line along the first direction D1.

The second fin-shaped pattern 210 and the fourth fin-shaped pattern 410 may be defined by the fin trench FT extending in the first direction D1. The second fin-shaped pattern 210 may be spaced apart from the first fin-shaped pattern 110 in a second direction D2. The fourth fin-shaped pattern 410 may be spaced apart from the third fin-shaped pattern 310 in the second direction D2. The sixth fin-shaped pattern 610 may be spaced apart from the fifth fin-shaped pattern 510 in the second direction D2. Here, the first direction D1 may intersect the second direction D2 and a third direction D3. Also, the second direction D2 may intersect the third direction D3. The third direction D3 may be a direction perpendicular to an upper side of the substrate 100.

A field region FX may be disposed between the first active region RX1 and the second active region RX2. The field region FX may be defined by a deep trench DT that is deeper than the fin trench FT. The deep trench DT may define the first active region RX1 and the second active region RX2. For example, the deep trench DT may extend long, e.g., lengthwise, in the first direction D1. The deep trench DT may be formed, e.g., continuously, between the first fin-shaped pattern 110 and the second fin-shaped pattern 210, between the third fin-shaped pattern 310 and the fourth fin-shaped pattern 410, and between the fifth fin-shaped pattern 510 and the six fin-shaped pattern 610. In the semiconductor device according to some embodiments, the deep trench DT may distinguish between the first active region RX1 and the second active region RX2.

As an example, one of the first active region RX1 and the second active region RX2 may be an NMOS formation region, and the other thereof may be a PMOS formation region. In another embodiment, the first active region RX1 and the second active region RX2 may be the PMOS formation region. In still another embodiment, the first active region RX1 and the second active region RX2 may be the NMOS formation region.

Each of the first to sixth fin-shaped patterns 110, 210, 310, 410, 510 and 610 may be a part of the substrate 100, and may include an epitaxial layer that is grown from the substrate 100. Each of the first to sixth fin-shaped patterns 110, 210, 310, 410, 510 and 610 may include, e.g., silicon or germanium, which is an elemental semiconductor material. Further, each of the first to sixth fin-shaped patterns 110, 210, 310, 410, 510 and 610 may include a compound semiconductor, and may include, e.g., a group IV-IV compound semiconductor or a group III-V compound semiconductor.

The group IV-IV compound semiconductor may be, e.g., a binary compound or a ternary compound including at least two or more of carbon (C), silicon (Si), germanium (Ge) and tin (Sn), or a compound obtained by doping these elements with a group IV element. The group III-V compound semiconductor may be, e.g., one of a binary compound, a ternary compound, or a quaternary compound formed by combining at least one of aluminum (Al), gallium (Ga) and indium (In) as a group III element with one of phosphorus (P), arsenic (As) and antimony (Sb) as a group V element.

As an example, the fin-shaped patterns 110, 310 and 510 disposed in the first active region RX1 may include the same material as the fin-shaped patterns 210, 410 and 610 disposed in the second active region RX2. As another example, the fin-shaped patterns 110, 310 and 510 disposed in the first active region RX1 may include different materials from the fin-shaped patterns 210, 410 and 610 disposed in the second active region RX2.

The first fin-shaped pattern 110 and the second fin-shaped pattern 210 will be described as an example. The number of first fin-shaped patterns 110 disposed in the first active region RX1 is the same as the number of second fin-shaped patterns 210 disposed in the second active region RX2. For example, the number of the first fin-shaped patterns 110 disposed in the first active region RX1 and the second fin-shaped patterns 210 disposed in the second active region RX2 is shown as two, but the number of the first fin-shaped patterns 110 disposed in the first active region RX1 and the number of the second fin-shaped patterns 210 disposed in the second active region RX2 may be one or three or more.

The following description will be provided using the first to fourth fin-shaped patterns 110, 210, 310 and 410.

A field insulating film 105 may be disposed around the first to fourth fin-shaped patterns 110, 210, 310 and 410. Although not shown, the field insulating film 105 may be disposed around the fifth fin-shaped pattern 510 and the sixth fin-shaped pattern 610. The field insulating film 105 may fill the deep trench DT. The field insulating film 105 may fill a part of the fin trench FT. The first fin-shaped pattern 110 and the second fin-shaped pattern 210 will be described as an example. The field insulating film 105 may be formed on a part of the sidewalls of the first fin-shaped pattern 110 and a part of the sidewalls of the second fin-shaped pattern 210.

The first to fourth fin-shaped patterns 110, 210, 310 and 410 may each protrude upward beyond, e.g., above, the upper surface of the field insulating film 105. A fifth fin-shaped pattern 510 and a sixth fin-shaped pattern 610 may also protrude beyond the upper surface of the field insulating film 105. The field insulating film 105 may include, e.g., an oxide film, a nitride film, an oxynitride film or a combination thereof.

A first element isolation structure 165 and a second element isolation structure 166 may be disposed over the first active region RX1 and the second active region RX2, respectively. The first element isolation structure 165 and the second element isolation structure 166 may each extend long, e.g., lengthwise, in the second direction D2.

The first element isolation structure 165 may separate the first fin-shaped pattern 110 and the third fin-shaped pattern 310 adjacent to each other in the first direction D1. The first element isolation structure 165 may separate the second fin-shaped pattern 210 and the fourth fin-shaped pattern 410 adjacent to each other in the first direction D1.

The second element isolation structure 166 may separate the third fin-shaped pattern 310 and the fifth fin-shaped pattern 510 adjacent to each other in the first direction D1. The second element isolation structure 166 may separate the fourth fin-shaped pattern 410 and the sixth fin-shaped pattern 610 adjacent to each other in the first direction D1. Since the description of the second element isolation structure 166 may be substantially the same as the description of the first element isolation structure 165, the following description will focus on the first element isolation structure 165.

The first element isolation structure 165 may include a first sidewall 165_LS1 and a second sidewall 165_LS2. The first sidewall 165_LS1 of the first element isolation structure and the second sidewall 165_LS2 of the first element isolation structure may each extend long, e.g., lengthwise, in the second direction D2. The first sidewall 165_LS1 of the first element isolation structure is opposite to the second sidewall 165_LS2 of the first element isolation structure in the first direction D1.

Each of the first fin-shaped pattern 110 and the second fin-shaped pattern 210 comes into contact with the first sidewall 165_LS1 of the first element isolation structure. The first fin-shaped pattern 110 and the second fin-shaped pattern 210 may extend in the first direction D1 from the first sidewall 165_LS1 of the first element isolation structure. Each of the third fin-shaped pattern 310 and the fourth fin-shaped pattern 410 comes into contact with the second sidewall 165_LS2 of the first element isolation structure. The third fin-shaped pattern 310 and the fourth fin-shaped pattern 410 may extend in the first direction D1 from the second sidewall 165_LS2 of the first element isolation structure. For example, the upper surface 165US of the first element isolation structure 165 may be on the same plane as upper surfaces of gate capping patterns 145, 245 and 345, which will be described later, or at a different level.

The first element isolation structure 165 and the second element isolation structure 166 may include, e.g., at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), aluminum oxide (AlO), and combinations thereof. Each of the first element isolation structure 165 and the second element isolation structure 166 may be a single film or a multi-film.

Figure 2:
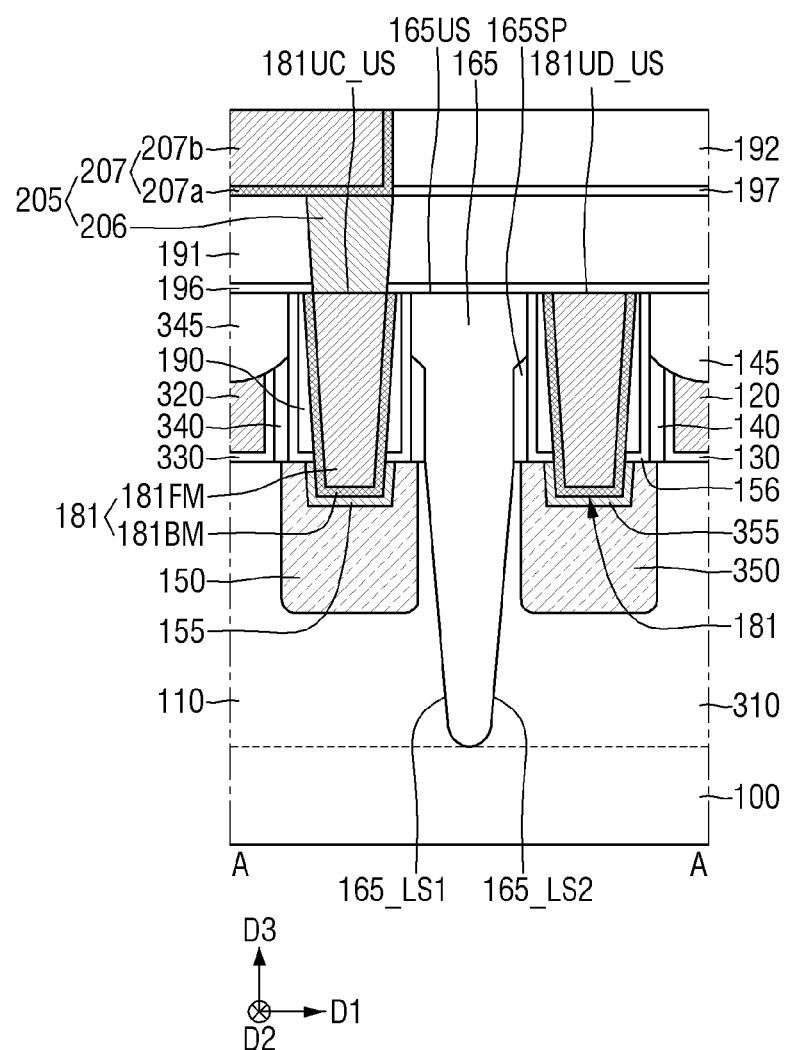
FIGS. 2 to 8 are cross-sectional views taken along lines A-A, B-B, C-C, D-D, E-E, F-F and G-G of FIG. 1, respectively.

For example, as illustrated I FIG. 2, an isolation structure spacer 165SP may extend along a part of the first sidewall 165_LS1 of the first element isolation structure. The isolation structure spacer 165SP may extend along a part of the second sidewall 165_LS2 of the first element isolation structure. The isolation structure spacer 165SP may include the same material as gate spacers 140, 240 and 340 to be described below. In another example, the isolation structure spacers 165SP may not be disposed on the sidewalls 165_LS1 and 165_LS2 of the first element isolation structure.

Each of the first to third gate electrodes 120, 220 and 320 may extend in the second direction D2. The first to third gate electrodes 120, 220 and 320 may each be disposed on the field insulating film 105.

The first gate electrode 120 may be disposed on the first active region RX1 and not on the second active region RX2, e.g., the first gate electrode 120 may be disposed only on the first active region RX1. The first gate electrode 120 may be disposed on the fin-shaped patterns 110, 310 and 510 disposed in the first active region RX1. The first gate electrode 120 may not disposed on the fin-shaped patterns 210, 410 and 610 disposed in the second active region RX2.

The second gate electrode 220 may be disposed on the second active region RX2 and not on the first active region RX1, e.g., the second gate electrode 220 may be disposed only on the second active region RX2. The second gate electrode 220 may be disposed on the fin-shaped patterns 210, 410 and 610 disposed in the second active region RX2. The second gate electrode 220 may not be disposed on the fin-shaped patterns 110, 310 and 510 disposed in the first active region RX1.

The third gate electrode 320 may be disposed, e.g., continuously, over the first active region RX1 and the second active region RX2. The third gate electrode 320 may be disposed on the fin-shaped patterns 110, 310 and 510 disposed in the first active region RX1. The third gate electrode 320 may be disposed on the fin-shaped patterns 210, 410 and 610 disposed in the second active region RX2.

The first gate electrode 120 and the second gate electrode 220 may be spaced apart from each other in the second direction D2 and aligned with each other in the second direction D2. The first gate electrode 120 may be disposed to correspond to, e.g., be aligned with, the second gate electrode 220. The third gate electrode 320 may be spaced apart from the first gate electrode 120 in the first direction D1. The third gate electrode 320 may be spaced apart from the second gate electrode 220 in the first direction D1.

For example, as illustrated in FIG. 1, the first gate electrode 120 and the second gate electrode 220 may have a one-to-one correspondence. In another example, at least one of the first gate electrodes 120 may face an insulating material gate disposed in the second active region RX2 and extending in the second direction D2. In yet another example, at least one of the second gate electrodes 220 may face the insulating material gate disposed in the first active region RX1 and extending in the second direction D2. The insulating material gate may be similar to the element isolation structures 165 and 166 described above.

Figure 3:
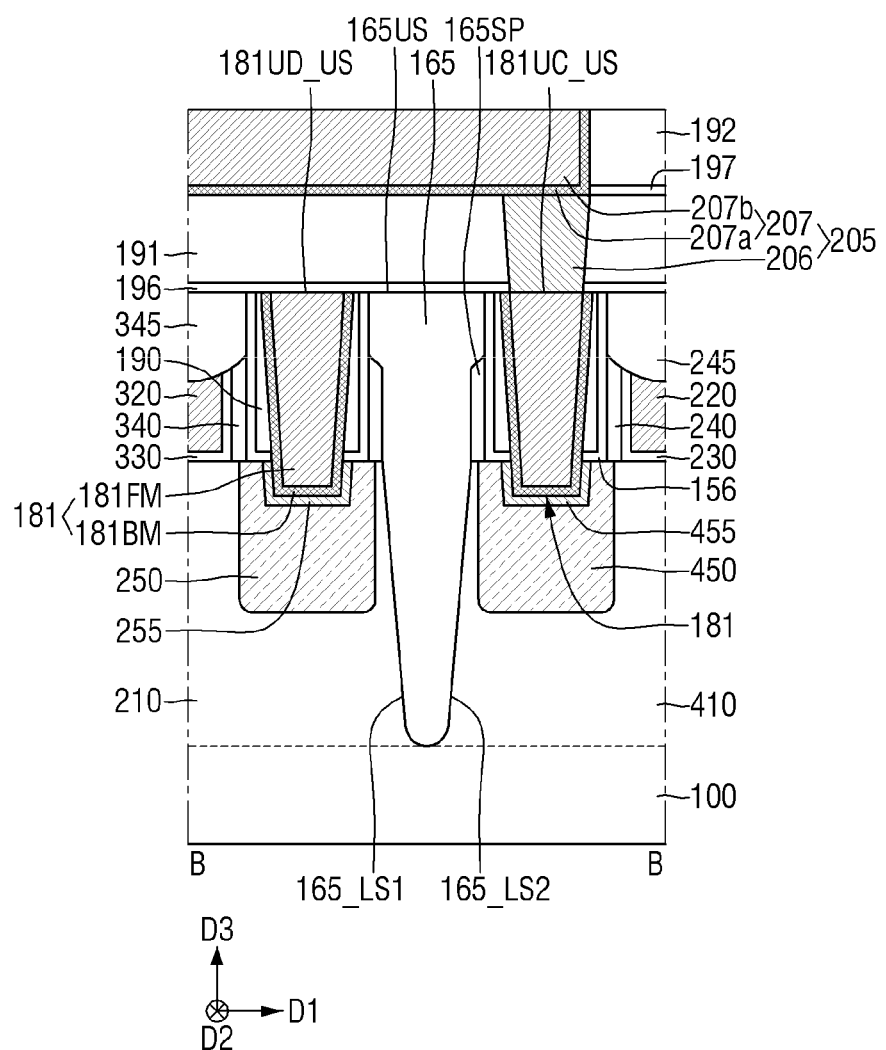

For example, as illustrated in FIGS. 2-3, upper surfaces of the gate electrodes 120, 220 and 320 may include concave curved surfaces. A part of the gate electrodes 120, 220 and 320 may be removed before forming gate capping patterns 145, 245 and 345, which will be described later. At least a part of the upper surfaces of the gate electrodes 120, 220 and 320 may be changed into a concave curved surface by an etching process that removes a part of the gate electrodes 120, 220 and 320. For example, the upper surface of the first gate electrode 120 and the upper surface of the second gate electrode 220 may have a concave shape in the cross-sectional view as in FIG. 8.

Each of the first to third gate electrodes 120, 220 and 320 may include, e.g., at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The first to third gate electrodes 120, 220 and 320 may each include conductive metal oxides, conductive metal oxynitrides, and the like, and may include oxidized forms of the above materials.

The first gate electrode 120 and the second gate electrode 220 may be separated by the gate isolation structure 160. The gate isolation structure 160 may separate the first gate electrode 120 and the second gate electrode 220 from each other in the second direction D2.

The gate isolation structure 160 is disposed on the field region FX. The gate isolation structure 160 may be disposed on the field insulating film 105. The gate isolation structure 160 may separate the first gate electrode 120 and the second gate electrode 220 corresponding to each other. The gate isolation structure 160 may be, e.g., at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), aluminum oxide (AlO), and combinations thereof. Although the gate isolation structure 160 is shown to be a single film.

Figure 8:
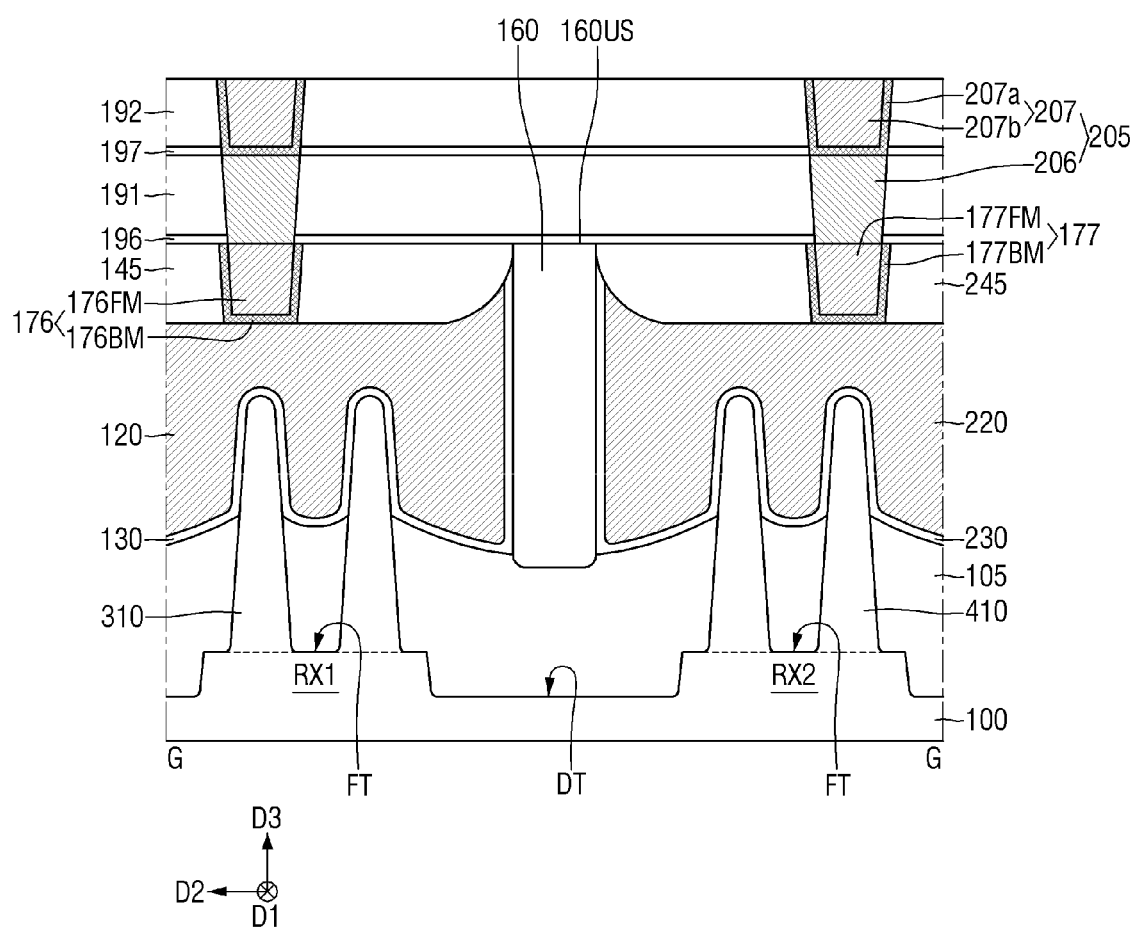
Figure 9:
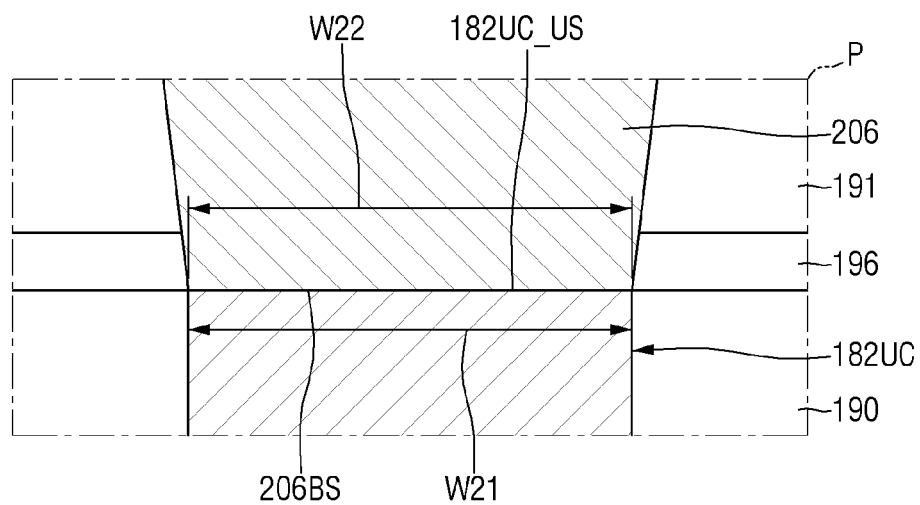
FIG. 9 is an enlarged view of portion P of FIG. 6.

For example, as illustrated in FIG. 8, a part of the gate isolation structure 160 may extend into the field insulating film 105. For example, the upper surface 160US of the gate isolation structure may be disposed on the same plane as the upper surface of the first gate capping pattern 145 and the upper surface of the second gate capping pattern 245.

A first gate spacer 140 may be disposed on sidewalls of the first gate electrode 120. A second gate spacer 240 may be disposed on sidewalls of the second gate electrode 220. A third gate spacer 340 may be disposed on sidewalls of the third gate electrode 320. The first to third gate spacers 140, 240 and 340 may extend along the second direction D2. The first to third gate spacers 140, 240 and 340 may include, e.g., at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

The first gate insulating film 130 may extend along sidewalls and a bottom surface of the first gate electrode 120. The first gate insulating film 130 may be disposed between the first gate electrode 120 and the fin-shaped patterns 110, 310 and 510 disposed in the first active region RX1. The second gate insulating film 230 may extend along sidewalls and a bottom surface of the second gate electrode 220. The second gate insulating film 230 may be disposed between the second gate electrode 220 and the fin-shaped patterns 210, 410 and 610 disposed in the second active region RX2. The third gate insulating film 330 may extend along sidewalls and a bottom surface of the third gate electrode 320. The third gate insulating film 330 may be disposed between the third gate electrode 320 and the fin-shaped patterns 110, 310 and 510 disposed in the first active region RX1. The third gate insulating film 330 may be disposed between the third gate electrode 320 and the fin-shaped patterns 210, 410 and 610 disposed in the second active region RX2.

Figure 7:
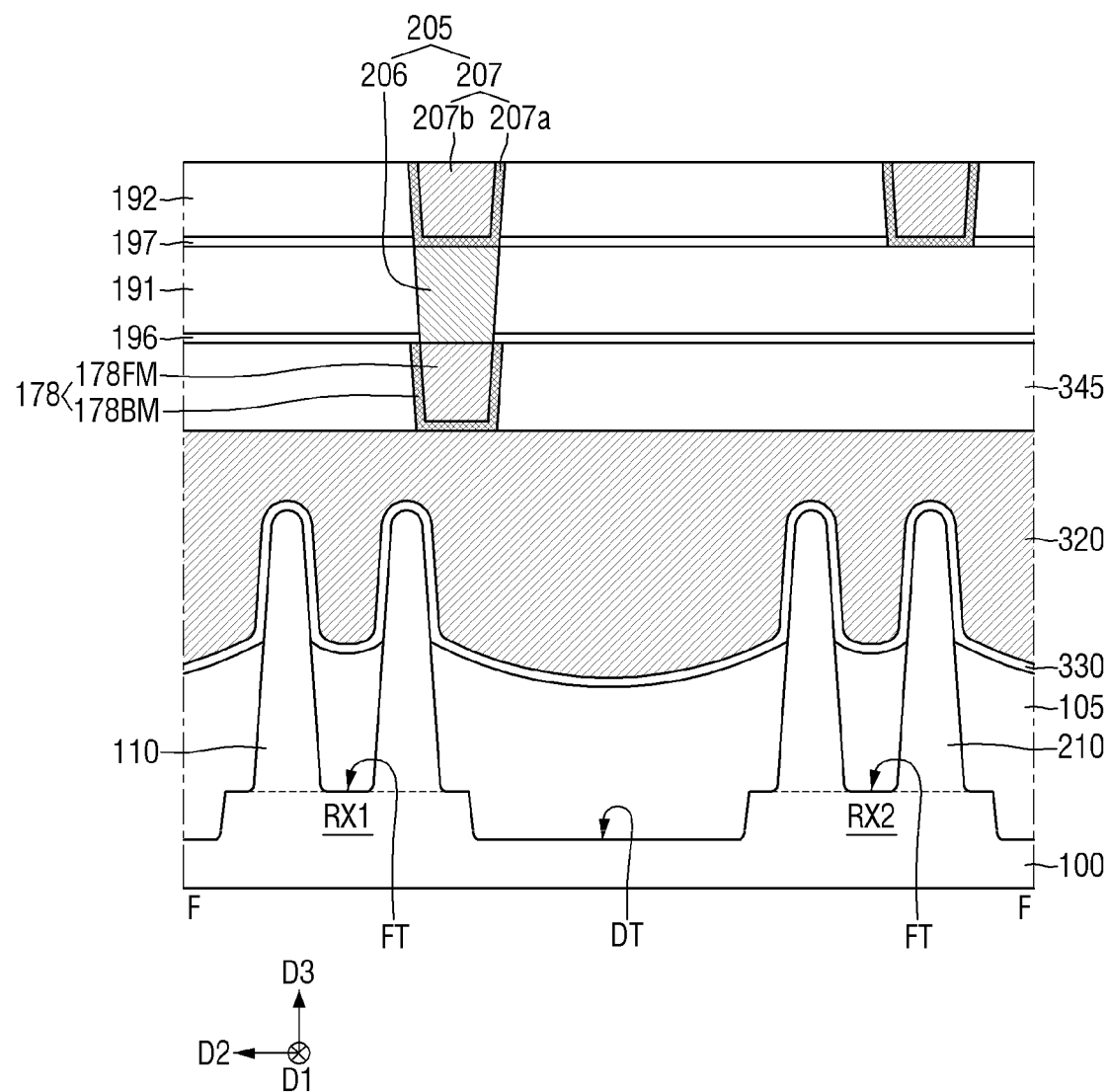

For example, as illustrated in FIG. 8, the first gate insulating film 130 may be formed along the profile of the third fin-shaped pattern 310 protruding above the field insulating film 105 and the upper surface of the field insulating film 105. The second gate insulating film 230 may be formed along the profile of the fourth fin-shaped pattern 410 protruding above the field insulating film 105 and the upper surface of the field insulating film 105. For example, as illustrated in FIG. 7, the third gate insulating film 330 may be formed along the profiles of the first fin-shaped pattern 110 and the second fin-shaped pattern 210 protruding above the field insulating film 105 and the upper surface of the field insulating film 105. For example, the first gate insulating film 130 may include an interface film along the profile of the third fin-shaped pattern 310 protruding above the field insulating film 105, e.g., the interface film may include silicon oxide.

For example, as illustrated in FIG. 8, the first gate insulating film 130 may extend along sidewalls of the first gate electrode 120 and sidewalls of the gate isolation structure 160 that face each other in the second direction D2. The second gate insulating film 230 may extend along sidewalls of the second gate electrode 220 and sidewalls of the gate isolation structure 160 that face each other in the second direction D2.

The first to third gate insulating films 130, 230 and 330 may include, e.g., silicon oxide, silicon oxynitride, silicon nitride or a high dielectric constant material having a higher dielectric constant than that of silicon oxide. The high dielectric constant material may include, e.g., one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

A semiconductor device according to some embodiments may include an NC (Negative Capacitance) FET that uses a negative capacitor. For example, the first to third gate insulating films 130, 230 and 330 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitances may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) below 60 mV/decade at room temperature.

The ferroelectric material film may have ferroelectric properties. The ferroelectric material film may include, e.g., at least one of hafnium oxide, hafnium zirconium oxide, barium strontium titanium oxide, barium titanium oxide, and lead zirconium titanium oxide. For example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, e.g., at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include at least one of, e.g., a silicon oxide and a metal oxide having a high dielectric constant. The metal oxide included in the paraelectric material film may include, e.g., at least one of hafnium oxide, zirconium oxide, and aluminum oxide.

The ferroelectric material film and the paraelectric material film may include the same material. The ferroelectric material film has ferroelectric properties, but the paraelectric material film may not have ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness imparting the ferroelectric properties. A thickness of the ferroelectric material film may be, e.g., 0.5 to 10 nm. Since a critical thickness that exhibits the ferroelectric properties may vary for each ferroelectric material, the thickness of the ferroelectric material film may vary depending on the ferroelectric material.

As an example, each of the first to third gate insulating films 130, 230 and 330 may include one ferroelectric material film. As another example, each of the first to third gate insulating films 130, 230 and 330 may include a plurality of ferroelectric material films spaced apart from each other. The first to third gate insulating films 130, 230 and 330 may have a stacked film structure in which the plurality of ferroelectric material films and the plurality of paraelectric material films are alternately stacked.

The first to third gate capping patterns 145, 245 and 345 may be disposed on the first to third gate electrodes 120, 220 and 320. Also, the first to third gate capping patterns 145, 245 and 345 may be disposed on upper surfaces of the first to third gate spacers 140, 240 and 340. Each of the first to third gate capping patterns 145, 245 and 345 may include, e.g., at least one of silicon nitride (SiN), silicon oxynitride (SiON), silicon oxide (SiO$_2$), silicon carbonitride (SiCN), silicon oxycarbonitride (SiOCN), and combinations thereof.

Unlike that shown, each of the first to third gate capping patterns 145, 245 and 345 may be disposed between the first to third gate spacers 140, 240 and 340. In such a case, the first gate capping pattern 145 will be described as an example. The upper surface of the first gate capping pattern 145 may be disposed on the same plane as the upper surface of the first gate spacer 140.

A first source/drain pattern 150 may be disposed on the first fin-shaped pattern 110. The first source/drain pattern 150 may be connected to the first fin-shaped pattern 110. A third source/drain pattern 350 may be disposed on the third fin-shaped pattern 310. The third source/drain pattern 350 may be connected to the third fin-shaped pattern 310. The first source/drain pattern 150 and the third source/drain pattern 350 may be disposed in the first active region RX1.

A second source/drain pattern 250 may be disposed on the second fin-shaped pattern 210. The second source/drain pattern 250 may be connected to the second fin-shaped pattern 210. A fourth source/drain pattern 450 may be disposed on the fourth fin-shaped pattern 410. The fourth source/drain pattern 450 may be connected to the fourth fin-shaped pattern 410. The second source/drain pattern 250 and the fourth source/drain pattern 450 may be disposed in the second active region RX2.

The second source/drain pattern 250 is separated from the first source/drain pattern 150 in the second direction D2. That is, the second source/drain pattern 250 is not directly connected to the first source/drain patterns 150. The third source/drain pattern 350 is separated from the fourth source/drain pattern 450 in the second direction D2.

The first source/drain pattern 150 may be connected to the plurality of first fin-shaped patterns 110. The second source/drain patterns 250 may be connected to the plurality of second fin-shaped patterns 210. The third source/drain pattern 350 may be connected to the plurality of third fin-shaped patterns 310. The fourth source/drain pattern 450 may be connected to the plurality of fourth fin-shaped patterns 410. Each of the first to fourth source/drain patterns 150, 250, 350 and 450 may be a shared epitaxial pattern. Each of the first to fourth source/drain patterns 150, 250, 350 and 450 may be included in the source/drain of the transistor that uses the first to fourth fin-shaped patterns 110, 210, 310 and 410 as channel regions.

For example, a source/drain pattern may be disposed on the fifth fin-shaped pattern 510 and the sixth fin-shaped pattern 610. The following description will be provided, using the first to fourth source/drain patterns 150, 250, 350 and 450.

A source/drain etch stop film 156 may be disposed on sidewalls of the first to third gate electrodes 120, 220 and 320 and on the first to fourth source/drain patterns 150, 250, 350 and 450. The source/drain etch stop film 156 may include a material having an etch selectivity with respect to a lower interlayer insulating film 190, which will be described later. The source/drain etch stop film 156 may include, e.g., at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

The lower interlayer insulating film 190 may be disposed on the source/drain etch stop film 156. The lower interlayer insulating film 190 may not cover the upper surfaces of the first to third gate capping patterns 145, 245 and 345. For example, the upper surface of the lower interlayer insulating film 190 may be disposed on the same plane as the upper surface of the first gate capping pattern 145, the upper surface of the second gate capping pattern 245, and the upper surface of the third gate capping pattern 345. The upper surface of the lower interlayer insulating film 190 may be disposed on the same plane as the upper surface of the upper surface 165US of the first device structure.

The lower interlayer insulating film 190 may include, e.g., at least one of silicon oxide, silicon nitride, silicon oxynitride, and a low dielectric constant material. The low dielectric constant material may include, e.g. at least one of Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethylcyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams, e.g., polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

A first connecting source/drain contact 181 and a second connecting source/drain contact 182 may be disposed over the first active region RX1 and the second active region RX2. The first connecting source/drain contact 181 and the second connecting source/drain contact 182 may each extend long, e.g., lengthwise, in the second direction D2.

The first connecting source/drain contact 181 and the second connecting source/drain contact 182 may be disposed on the source/drain patterns 150 and 350 disposed in the first active region RX1 and the source/drain patterns 250 and 450 disposed in the second active region RX2. The first connecting source/drain contact 181 and the second connecting source/drain contact 182 are connected to the source/drain patterns 150 and 350 disposed in the first active region RX1 and the source/drain patterns 250 and 450 disposed in the second active region RX2 at the same time. The first connecting source/drain contact 181 and the second connecting source/drain contact 182 may be disposed on the fin-shaped patterns 110 and 310 disposed in the first active region RX1 and the fin-shaped patterns 210 and 410 disposed in the second active region RX2.

The first source/drain contact 171 may be disposed on the source/drain patterns 150 and 350 disposed in the first active region RX1. A second source/drain contact 172 may be disposed on the source/drain patterns 250 and 450 disposed in the second active region RX2. The first source/drain contact 171 is connected to the first and third source/drain patterns 150 and 350, but is not connected to the second and fourth source/drain patterns 250 and 450. The second source/drain contact 172 is connected to the second and fourth source/drain patterns 250 and 450, but is not connected to the first and third source/drain patterns 150 and 350.

For example, the second connecting source/drain contact 182, the first source/drain contact 171, and the second source/drain contact 172 may be additionally disposed on the first source/drain pattern 150 and/or the second source/drain pattern 250. The first connecting source/drain contact 181, the second connecting source/drain contact 182, the first source/drain contact 171, and the second source/drain contact 172 may each be disposed inside the lower interlayer insulating film 190.

A first silicide film 155 may be formed between the first source/drain pattern 150 and the source/drain contacts 181, 182 and 171. A second silicide film 255 may be formed between the second source/drain pattern 250 and the source/drain contacts 181, 182 and 172. A third silicide film 355 may be formed between the third source/drain pattern 350 and the source/drain contacts 181, 182 and 171. A fourth silicide film 455 may be formed between the fourth source/drain pattern 250 and the source/drain contacts 181, 182 and 172. Each of the first to fourth silicide films 155, 255, 355 and 455 may include, e.g., a metal silicide material.

The first connecting source/drain contact 181 may be disposed between the element isolation structures 165 and 166 and the gate electrodes 120, 220 and 320. The element isolation structures 165 and 166 are disposed on one side of the first connecting source/drain contact 181, and gate electrodes 120, 220 and 320 may be disposed on the other side of the first connecting source/drain contact 181.

The first connecting source/drain contact 181 may be a connecting source/drain contact that is closest to the element isolation structures 165 and 166, e.g., in the first direction D1. For example, as illustrated in FIG. 1, the element isolation structure 165 may be between two first connecting source/drain contacts 181. That is, none of the gate electrodes 120, 220 and 320 is disposed between the element isolation structures 165 and 166 and the first connecting source/drain contact 181 adjacent thereto.

In the semiconductor device according to some embodiments, the first connecting source/drain contacts 181 may be disposed on both sides of, e.g., each of, the element isolation structures 165 and 166. Alternatively, the element isolation structures 165 and 166 may be disposed between the first connecting source/drain contacts 181 adjacent to each other in the first direction D1.

For example, the first connecting source/drain contact 181 connected to the first source/drain pattern 150 and the second source/drain pattern 250 may be between the first element isolation structure 165 and the third gate electrode 320. In another example, the first connecting source/drain contacts 181 connected to the first source/drain pattern 150 and the second source/drain pattern 250 may be disposed between the first element isolation structure 165 and the first gate electrode 120, and between the first element isolation structure 165 and the second gate electrode 220.

For example, the first connecting source/drain contact 181 connected to the third source/drain pattern 350 and the fourth source/drain pattern 450 may be between the first element isolation structure 165 and the first gate electrode 120, and between the first element isolation structure 165 and the second gate electrode 220. In another example, the first connecting source/drain contacts 181 connected to the third source/drain pattern 350 and the fourth source/drain pattern 450 may be disposed between the first element isolation structure 165 and the third gate electrode 320.

Because the description for the first connecting source/drain contact 181 closest to the second element isolation structure 166 may be substantially the same as the description for the first connecting source/drain contact 181 closest to the first element isolation structure 165, the following description will focus on the first element isolation structure 165.

The second connecting source/drain contact 182 may be disposed between the gate electrodes 120, 220 and 320 adjacent to each other in the first direction D1. The second connecting source/drain contact 182 is not a connecting source/drain contact that is closest to the element isolation structures 165 and 166. That is, at least one or more gate electrodes 120, 220 and 320 are disposed between the second connecting source/drain contacts 182 and the element isolation structures 165 and 166.

For example, as illustrated in FIG. 1, the first gate electrode 120 and the second gate electrode 220 may be on one side of the second connecting source/drain contact 182 and the third gate electrode 320 may be on the other side of the second connecting source/drain contact 182. In another example, the first gate electrode 120 and the second gate electrode 220 may be disposed on one side of the second connecting source/drain contact 182 and on the other side of the second connecting source/drain contact 182. In yet another example, the second connecting source/drain contact 182 may be disposed between the third gate electrodes 320.

For example, as illustrated in FIG. 1, the first connecting source/drain contact 181 and the second connecting source/drain contact 182 may be disposed together on the third fin-shaped pattern 310 and the fourth fin-shaped pattern 410. In another example, an additional third element isolation structure may be disposed between the first connecting source/drain contact 181 and the second connecting source/drain contact 182. In such a case, the first connecting source/drain contact 181 may be on the third fin-shaped pattern 310 and the fourth fin-shaped pattern 410, but the second connecting source/drain contact 182 may not be on the third fin-shaped pattern 310 and the fourth fin-shaped pattern 410. The second connecting source/drain contact 182 may be on seventh and eighth fin-shaped patterns between the second element isolation structure 166 and the third element isolation structure.

In the following description, the first connecting source/drain contact 181 and the second connecting source/drain contact 182 will be described as being disposed together on the third fin-shaped pattern 310 and the fourth fin-shaped pattern 410.

The first connecting source/drain contact 181 may include a first lower contact region 181B, a first upper contact region 181UC, and a first dummy contact region 181UD.

The first lower contact region 181B may intersect the first fin-shaped pattern 110 and the second fin-shaped pattern 210. The first lower contact region 181B is connected to the first source/drain pattern 150 and the second source/drain pattern 250 at the same time, e.g., the first lower contact region 181B may be connected simultaneously to both the first source/drain pattern 150 and the second source/drain pattern 250. The first lower contact region 181B may intersect the third fin-shaped pattern 310 and the fourth fin-shaped pattern 410. The first lower contact region 181B is connected to the third source/drain pattern 350 and the fourth source/drain pattern 450 at the same time.

The first upper contact region 181UC and the first dummy contact region 181UD may protrude from the first lower contact region 181B in the third direction D3, e.g., in a direction oriented away from the fin-shaped patterns. The first upper contact region 181UC and the first dummy contact region 181UD may be separated, e.g., and spaced apart, from each other in the second direction D2. The first connecting source/drain contact 181 may include a plurality of contact regions that protrudes from the first lower contact region 181B in the third direction D3.

The first lower contact region 181B is directly connected to the first upper contact region 181UC and the first dummy contact region 181UD. The first lower contact region 181B, the first upper contact region 181UC, and the first dummy contact region 181UD may have an integral structure, e.g., a uniform and seamless structure formed of a same material. For example, in the fabricating process, after forming a pre-structure of the first connecting source/drain contact 181, a part of the pre-structure may be removed. An upper surface of the pre-structure of the first connecting source/drain contact 181 may be on the same plane as, e.g., coplanar with, the upper surface of the lower interlayer insulating film 190. The first lower contact region 181B, the first upper contact region 181UC, and the first dummy contact region 181UD may be formed by removing a part of the pre-structure. Because a part of the pre-structure of the first connecting source/drain contact 181 is etched to form the first upper contact region 181UC and the first dummy contact region 181UD, there is no boundary line on which the first lower contact region 181B and the first upper contact region 181UC are divided, and a boundary line on which the first lower contact region 181B and the first dummy contact region 181UD are divided, i.e., no visible boundary line between the first lower contact region 181B and each of the first upper contact region 181UC and the first dummy contact region 181UD.

The upper surface of the first connecting source/drain contact 181 may be an upper surface 181UC_US of the first upper contact region 181UC and an upper surface 181UD_US of the first dummy contact region 181UD. The upper surface 181UC_US of the first upper contact region and the upper surface 181UD_US of the first dummy contact region may be disposed on the same plane as the upper surface of the lower interlayer insulating film 190.

The first lower contact region 181B may include a connecting portion 181B_CR and a protruding portion 181B_PR. The connecting portion 181B_CR of the first lower contact region is disposed between the first upper contact region 181UC and the first dummy contact region 181UD. The protruding portion 181B_PR of the first lower contact region may be a portion that protrudes from the first upper contact region 181UC and the first dummy contact region 181UD in the second direction D2. Each of the first upper contact region 181UC and the first dummy contact region 181UD may be disposed between the connecting portion 181B_CR of the first lower contact region and a corresponding protruding portion 181B_PR of the first lower contact region.

The first upper contact region 181UC may be a portion on which a via plug 206 to be described later lands. The first connecting source/drain contact 181 is connected with the wiring structure 205 through the first upper contact region 181UC. The wiring structure 205 comes into contact with the upper surface 181UC_US of the first upper contact region.

The first dummy contact region 181UD is a portion on which the via plug 206 does not land. The wiring structure 205 does not come into contact with the upper surface 181UD_US of the first dummy contact region. A first etch stop film 196, which will be described later, may, e.g., continuously, cover the entire upper surface 181UD_US of the first dummy contact region. Some of the plurality of contact regions protruding from the first lower contact region 181B in the third direction D3 are in contact with the via plug 206, e.g., through the first etch stop film 196, and the rest are not in contact with the via plugs 206, e.g., due to complete coverage by the first etch stop film 196.

Figure 4:
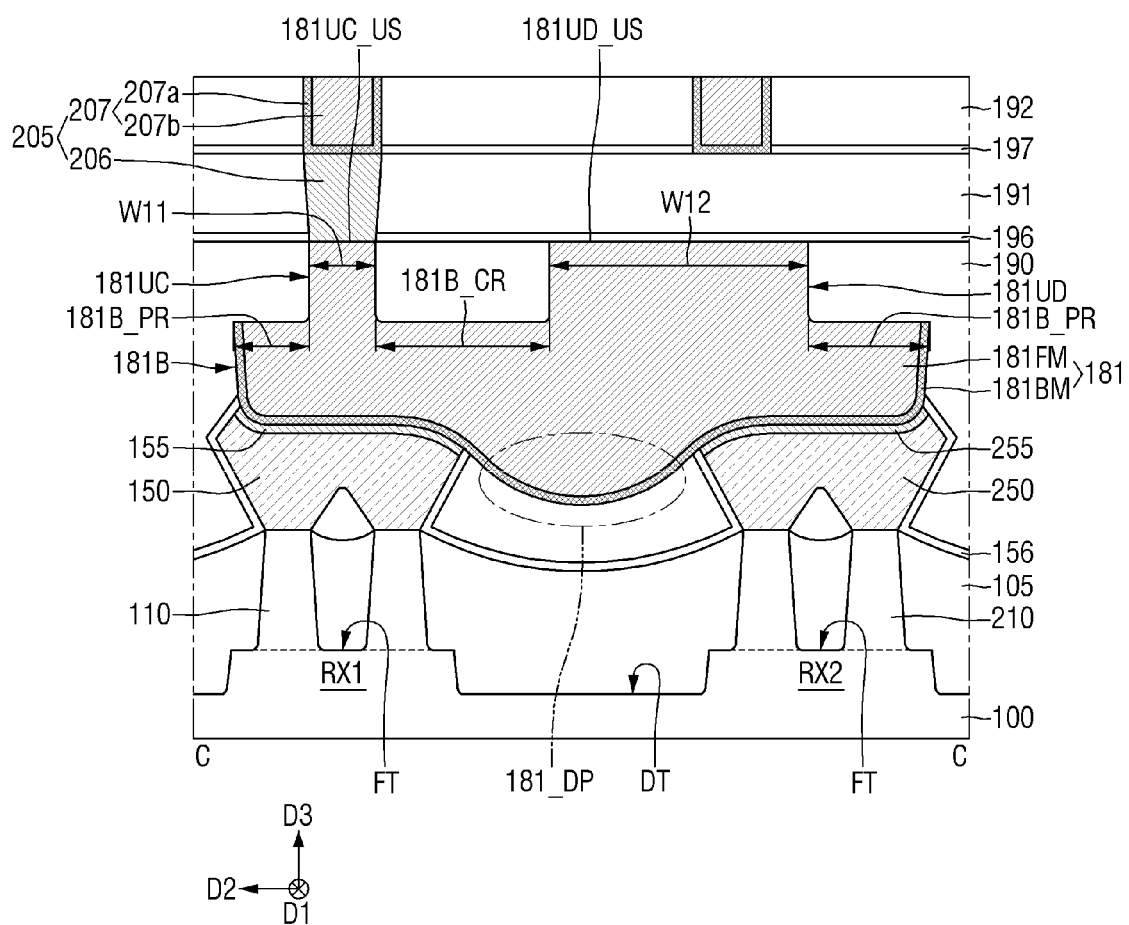

As an example, as illustrated in FIG. 4, a width W12 of the upper surface 181UD_US of the first dummy contact region in the second direction D2 may be greater than or the same as a width W11 of the upper surface 181UC_US of the first upper contact region in the second direction D2. As another example, the width W12 of the upper surface 181UD_US of the first dummy contact region in the second direction D2 may be smaller than the width W11 of the upper surface 181UC_US of the first upper contact region in the second direction D2.

For example, as illustrated in FIG. 4, the first lower contact region 181B may include a first downward protruding region 181_DP that protrudes toward the substrate 100, between the first source/drain pattern 150 and the second source/drain pattern 250. In another example, the first downward protruding region 181_DP may come into contact with the source/drain etch stop film 156 or the field insulating film 105. The first lower contact region 181B may include one first downward protruding region 181_DP.

The second connecting source/drain contact 182 may include a second lower contact region 182B and a second upper contact region 182UC. The second lower contact region 182B may intersect the third fin-shaped pattern 310 and the fourth fin-shaped pattern 410. The second lower contact region 182B may be connected to the third source/drain pattern 350 and the fourth source/drain pattern 450 at the same time.

The second upper contact region 182UC may protrude from the second lower contact region 182B in the third direction D3. The second connecting source/drain contact 182 may include one contact region protruding from the second lower contact region 182B in the third direction D3.

The second lower contact region 182B is directly connected to the second upper contact region 182UC. The second lower contact region 182B and the second upper contact region 182UC may have an integral structure.

An upper surface of the second connecting source/drain contact 182 may be an upper surface 182UC_US of the second upper contact region. The upper surface 182UC_US of the second upper contact region may be disposed on the same plane as the upper surface of the lower interlayer insulating film 190.

The second upper contact region 182UC may be a portion on which the via plug 206 lands. The second connecting source/drain contact 182 is connected with the wiring structure 205 through the second upper contact region 182UC. The wiring structure 205 comes into contact with the upper surface 182UC_US of the second upper contact region.

Figure 6:
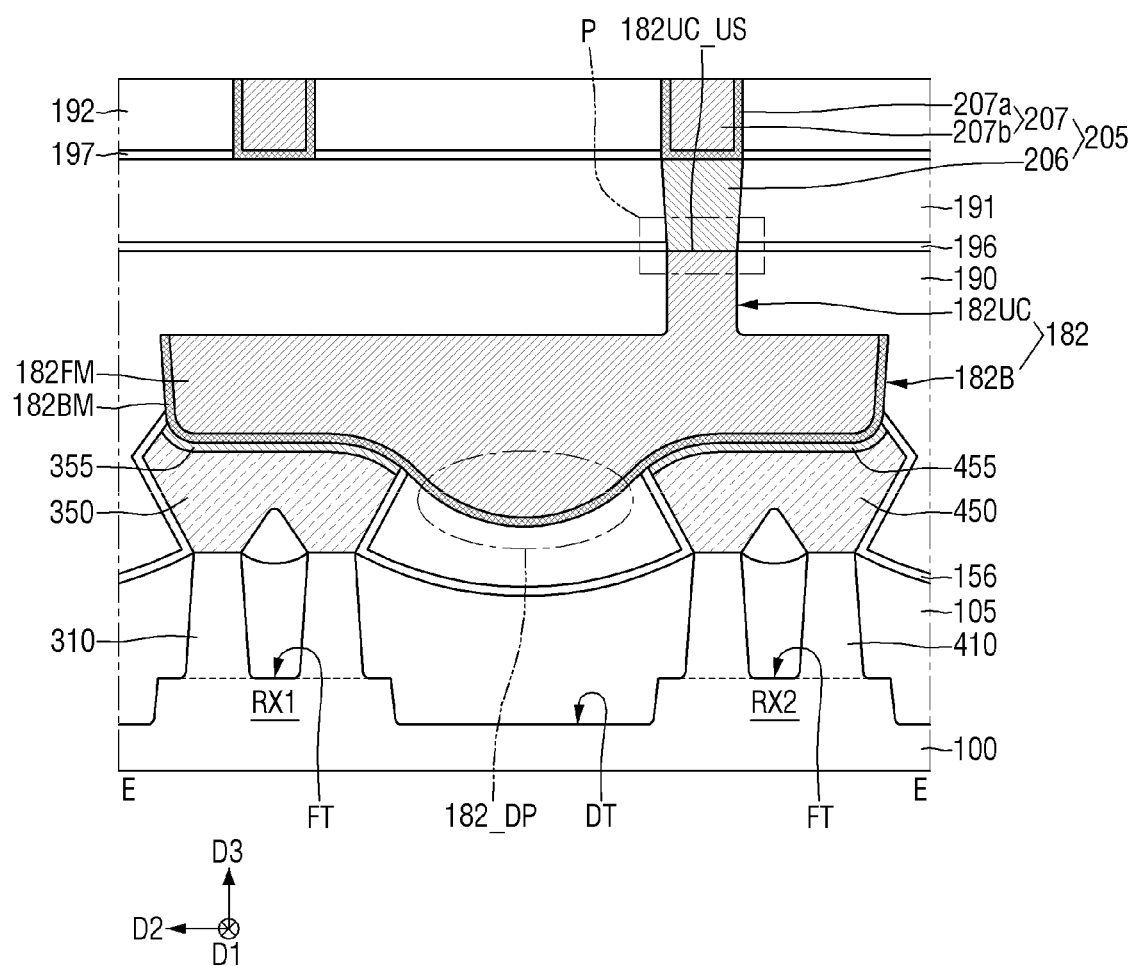

For example, as illustrated in FIG. 6, the second connecting source/drain contact 182 may have a shape similar to a "T" shape rotated by 180 degrees. Depending on the position of the second upper contact region 182UC, the second connecting source/drain contact 182 may have a shape similar to "L".

For example, as illustrated in FIG. 6, the second lower contact region 182B may include a second downward protruding region 182_DP that protrudes toward the substrate 100, between the third source/drain pattern 350 and the fourth source/drain pattern 450. In another example, the second downward protruding region 182_DP may come into contact with the source/drain etch stop film 156 or the field insulating film 105. The second lower contact region 182B may include one second downward protruding region 181_DP.

Figure 15:
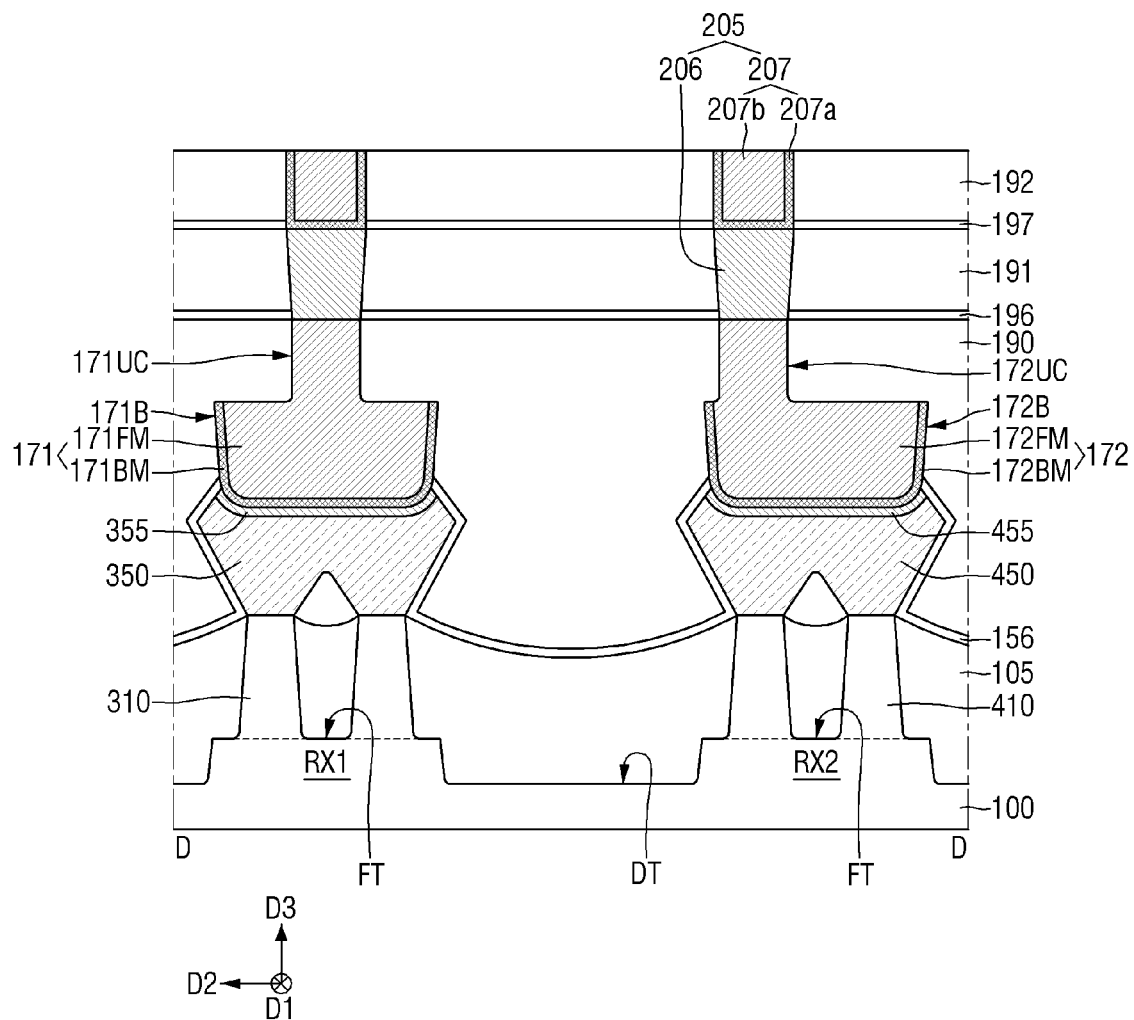

A cross-sectional view in which the first and second source/drain contacts 171 and 172 of FIG. 1 are cut in the second direction D2 may be similar to FIG. 15. A cross-sectional view in which the first source/drain contact 171 and the second source/drain contact 172 are cut in the second direction D2 may be one of a "T" shape or an "L" shape rotated by 180 degrees.

The first connecting source/drain contact 181 may include a first source/drain barrier film 181BM and a first source/drain filling film 181FM. The second connecting source/drain contact 182 may include a second source/drain barrier film 182BM and a second source/drain filling film 182FM.

A first gate contact 176 may be disposed on the first gate electrode 120. A second gate contact 177 may be disposed on the second gate electrode 220. A third gate contact 178 may be disposed on the third gate electrode 320. The first gate contact 176 will be described as an example. The first gate contact 176 may penetrate the first gate capping pattern 145 and is connected to the first gate electrode 120.

The first gate contact 176 may include a first gate barrier film 176BM and a first gate filling film 176FM. The second gate contact 177 may include a second gate barrier film 177BM and a second gate filling film 177FM. The third gate contact 178 may include a third gate barrier film 178BM and a third gate filling film 178FM.

From a viewpoint of plan view, the gate contacts 176, 177 and 178 connected to the gate electrodes 120, 220 and 320 closest to the first connecting source/drain contact 181 do not overlap the first upper contact region 181UC and the first dummy contact region 181UD in the first direction D1. In FIG. 1, taking the first connecting source/drain contact 181 intersecting the first fin-shaped pattern 110 and the second fin-shaped pattern 210 as an example, the first upper contact region 181UC and the first dummy contact region 181UD do not overlap the third gate contact 178 in the first direction D1.

In the semiconductor device according to some embodiments, the gate isolation structure 160 between the first gate electrode 120 and the second gate electrode 220 closest to the first connecting source/drain contact 181 do not overlap the upper contact region 181UC and the first dummy contact region 181UD in the first direction D1. In FIG. 1, taking the first connecting source/drain contact 181 intersecting the third fin-shaped pattern 310 and the fourth fin-shaped pattern 410 as an example, the first upper contact region 181UC and the first dummy contact region 181UD do not overlap the first gate contact 176, the second gate contact 177, and the gate isolation structure 160 in the first direction D1.

From a viewpoint of a plan view, the gate contacts 176, 177, and 178 connected to the gate electrodes 120, 220, and 320 closest to the second connecting source/drain contact 182 do not overlap the second upper contact region 182UC in the first direction D1. In the semiconductor device according to some embodiments, the gate isolation structure 160 between the first gate electrode 120 and the second gate electrode 220 closest to the second connecting source/drain contact 182 does not overlap the second upper contact region 182UC in the first direction D1.

The source/drain barrier films 181BM and 182BM and the gate barrier films 176BM, 177BM and 178BM may include, e.g., at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. In the semiconductor device according to some embodiments, the two-dimensional material may be a metallic material and/or a semiconductor material. The 2D material may include a 2D allotrope or a 2D compound, and may include at least one of graphene, molybdenum disulfide ($MoS_2$), molybdenum diselenide ($MoSe_2$), tungsten diselenide ($WSe_2$), and tungsten disulfide ($WS_2$). The source/drain filling films 181FM and 182FM and the gate filling films 176FM, 177FM and 178FM may include, e.g., at least one of aluminum (Al), tungsten (W), cobalt (Co), ruthenium (Ru), copper (Cu), silver (Ag), gold (Au), manganese (Mn), and molybdenum (Mo).

The first etch stop film 196 and the first upper interlayer insulating film 191 may be sequentially disposed on the first and second connecting source/drain contacts 181 and 182. The first etch stop film 196 and the first upper interlayer insulating film 191 may be disposed on the lower interlayer insulating film 190.

The first etch stop film 196 may include a material having an etch selectivity with respect to the first upper interlayer insulating film 191. The first etch stop film 196 may include, e.g., at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), aluminum nitride (AlN), aluminum oxycarbide (AlOC), and combinations thereof. Unlike that shown, the first etch stop film 196 may not be formed. The first upper interlayer insulating film 191 may include, e.g., at least one of silicon oxide, silicon nitride, silicon oxynitride, and a low dielectric constant material.

The via plug 206 may be disposed inside the first etch stop film 196 and the first upper interlayer insulating film 191. The via plug 206 passes through the first etching stop film 196 and the first upper interlayer insulating film 191, and may be connected to the first and second connecting source/drain contacts 181 and 182 and the first and second source/drain contacts 171 and 172. The via plug 206 comes into contact with the upper surface 181UC_US of the first upper contact region and the upper surface 182UC_US of the second upper contact region. However, the via plug 206 does not come into contact with the upper surface 181UD_US of the first dummy contact region. The via plug 206 passes through the first etch stop film 196 and the first upper interlayer insulating film 191, and may be connected to the gate contacts 176, 177 and 178.

The via plug 206 may have a single film structure. The via plug 206 may have a structure formed of a single film. That is, the via plug 206 may have a single conductive film structure. The via plug 206 may include, e.g., one of aluminum (Al), tungsten (W), cobalt (Co), ruthenium (Ru), silver (Ag), gold (Au), manganese (Mn), and molybdenum (Mo).

The via plug 206 connected to the source/drain contacts 171, 172, 181 and 182 may be a source/drain via plug. The via plug 206 connected to the gate contacts 176, 177 and 178 may be a gate via plug. For example, one of the source/drain via plug and the gate via plug may have a single film structure, and the other of the source/drain via plug and the gate via plug may have a multi-film structure (e.g., a combination of a barrier film and a filling film) such as the gate contacts 176, 177 and 178. In another example, the via plug 206 may have a multi-film structure.

In FIG. 9, a bottom surface 206BS of the via plug 206 may have a first via width W22 in the second direction D2. A width W21 of the upper surface 182UC_US of the second upper contact region in the second direction D2 may be the same as or larger than the first via width W22. Also, the width W21 of the upper surface 182UC_US of the second upper contact region in the second direction D2 may be smaller than or equal to 1.2 times the first via width W22.

Figure 5:
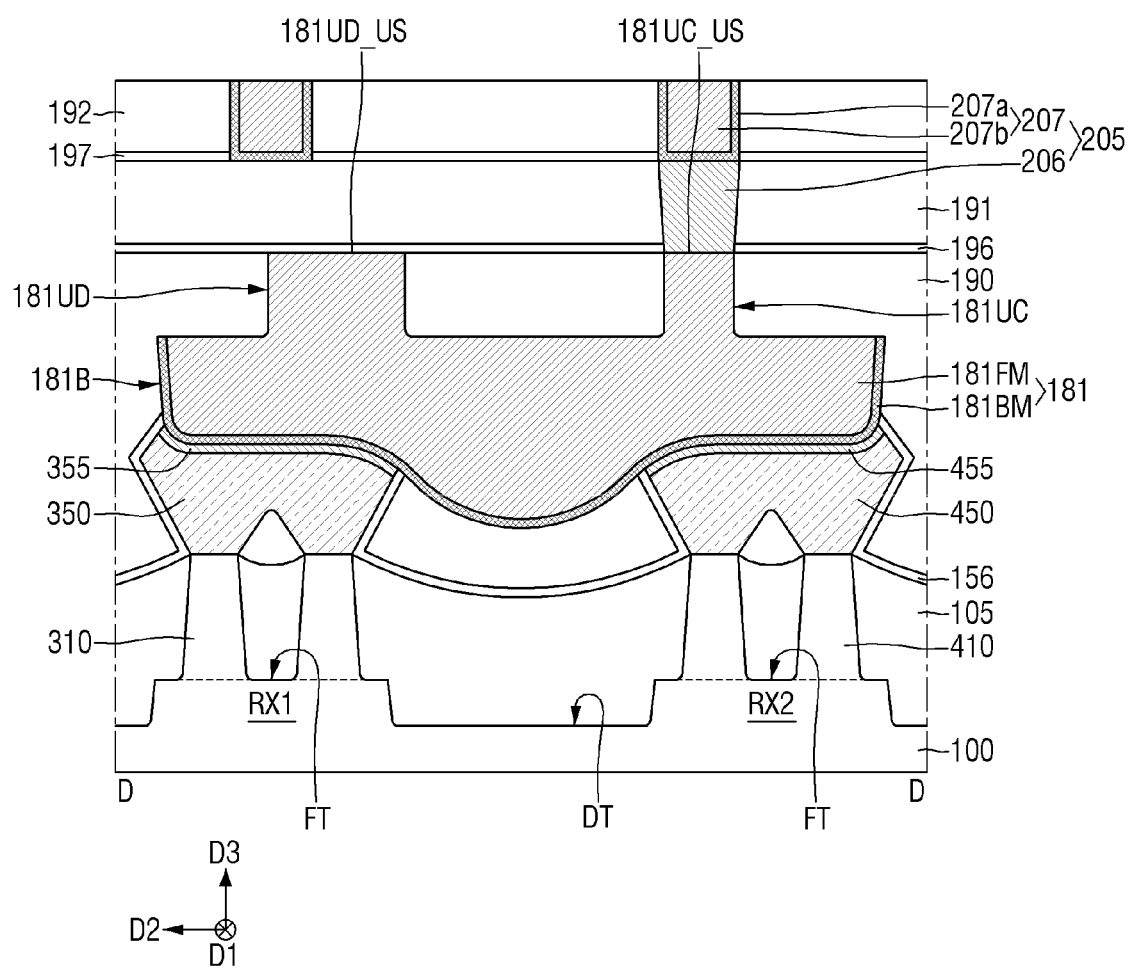

For example, as illustrated in FIGS. 5 and 6, a second etch stop film 197 and a second upper interlayer insulating film 192 may be sequentially disposed on the first upper interlayer insulating film 191. In another example, the second etch stop film 197 may not be formed. The description of the materials of the second etch stop film 197 and the second upper interlayer insulating film 192 may be the same as those of the first etch stop film 196 and the first upper interlayer insulating film 191.

A wiring line 207 may be disposed inside the second upper interlayer insulating film 192 and the second etch stop film 197. The wiring line 207 may be connected with the via plug 206. At least part of the wiring line 207 may extend long, e.g., lengthwise, in the first direction D1.

The wiring line 207 may include a wiring barrier film 207a and a wiring filling film 207b. The wiring barrier film 207a may include, e.g., at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. The wiring filling film 207b may include, e.g., at least one of aluminum (Al), copper (Cu), tungsten (W), cobalt (Co), ruthenium (Ru), silver (Ag), gold (Au), manganese (Mn), and molybdenum (Mo).

The wiring structure 205 may include the via plug 206 and the wiring line 207. The wiring structure 205 may be disposed on the source/drain contacts 171, 172, 181 and 182 and the gate contacts 176, 177 and 178. The wiring structure 205 may be connected to the source/drain contacts 171, 172, 181 and 182. The wiring structure 205 may be connected to the gate contacts 176, 177 and 178.

Unlike that shown, the wiring line 207 and the via plug 206 may have an integral structure. In such a case, a boundary between the wiring line 207 and the via plug 206 may not be distinguished, e.g., may not be visible.

Figure 10:
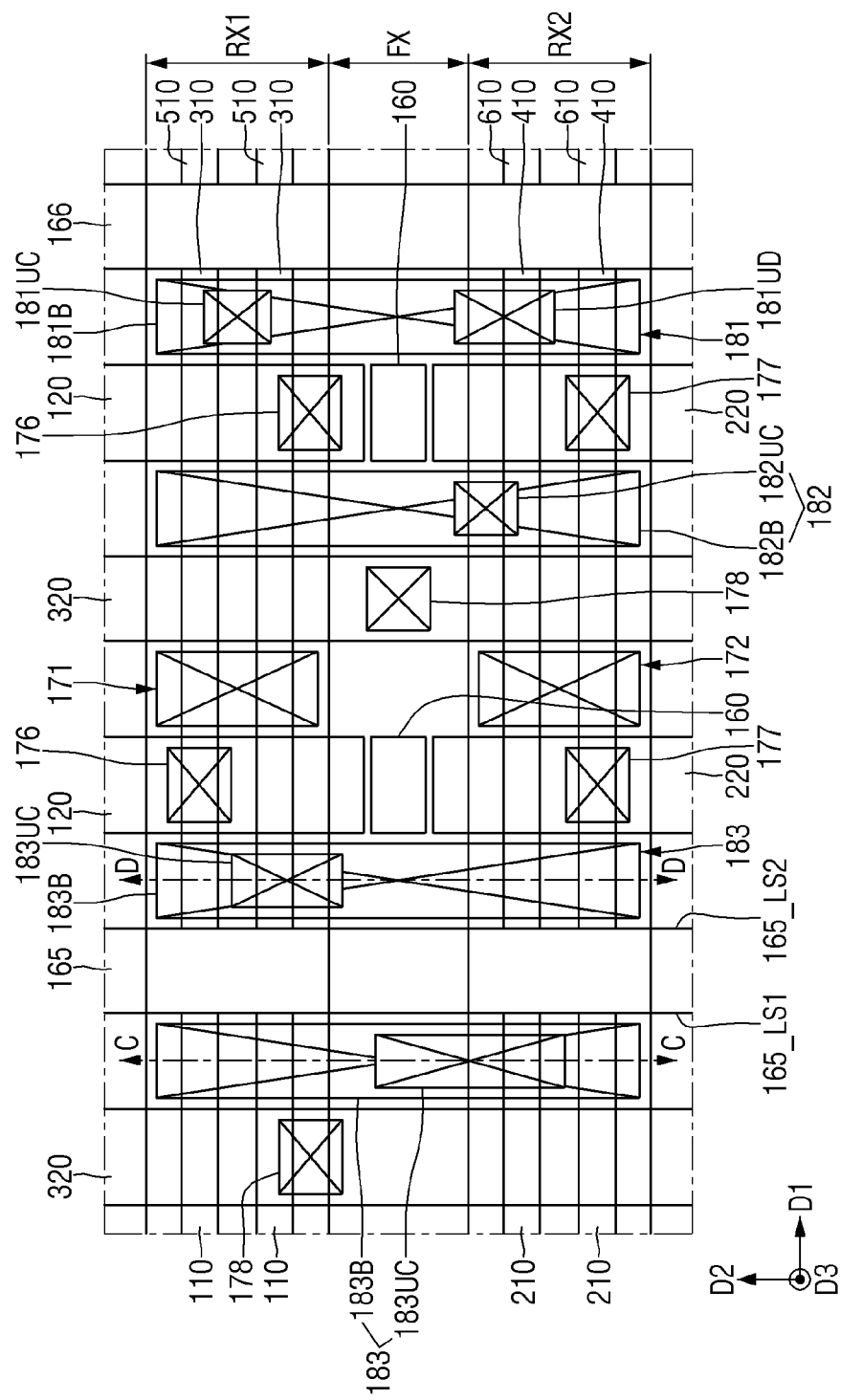
FIGS. 10 to 12 are diagrams of a semiconductor device according to some embodiments.
Figure 11:
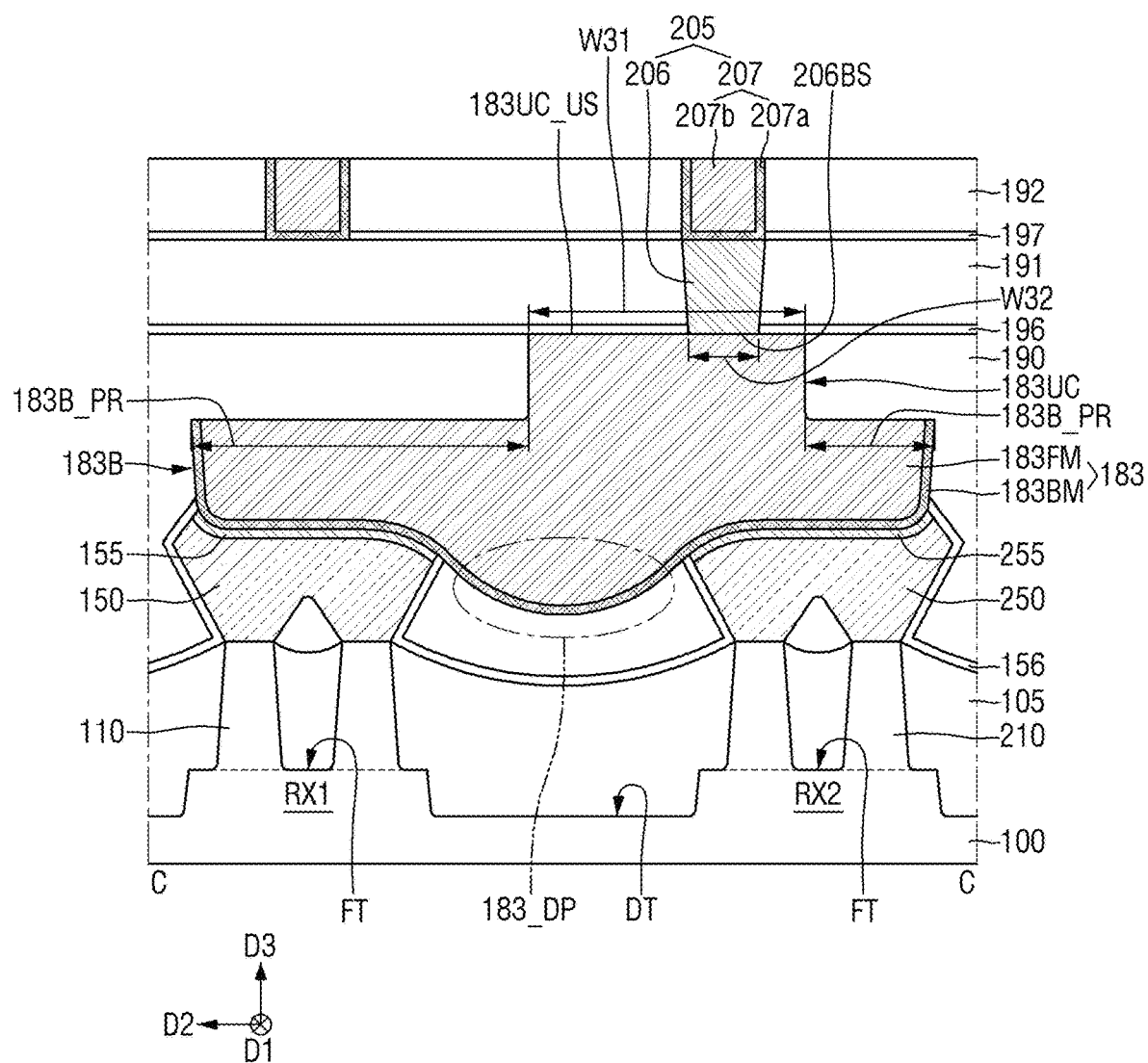
Figure 12:
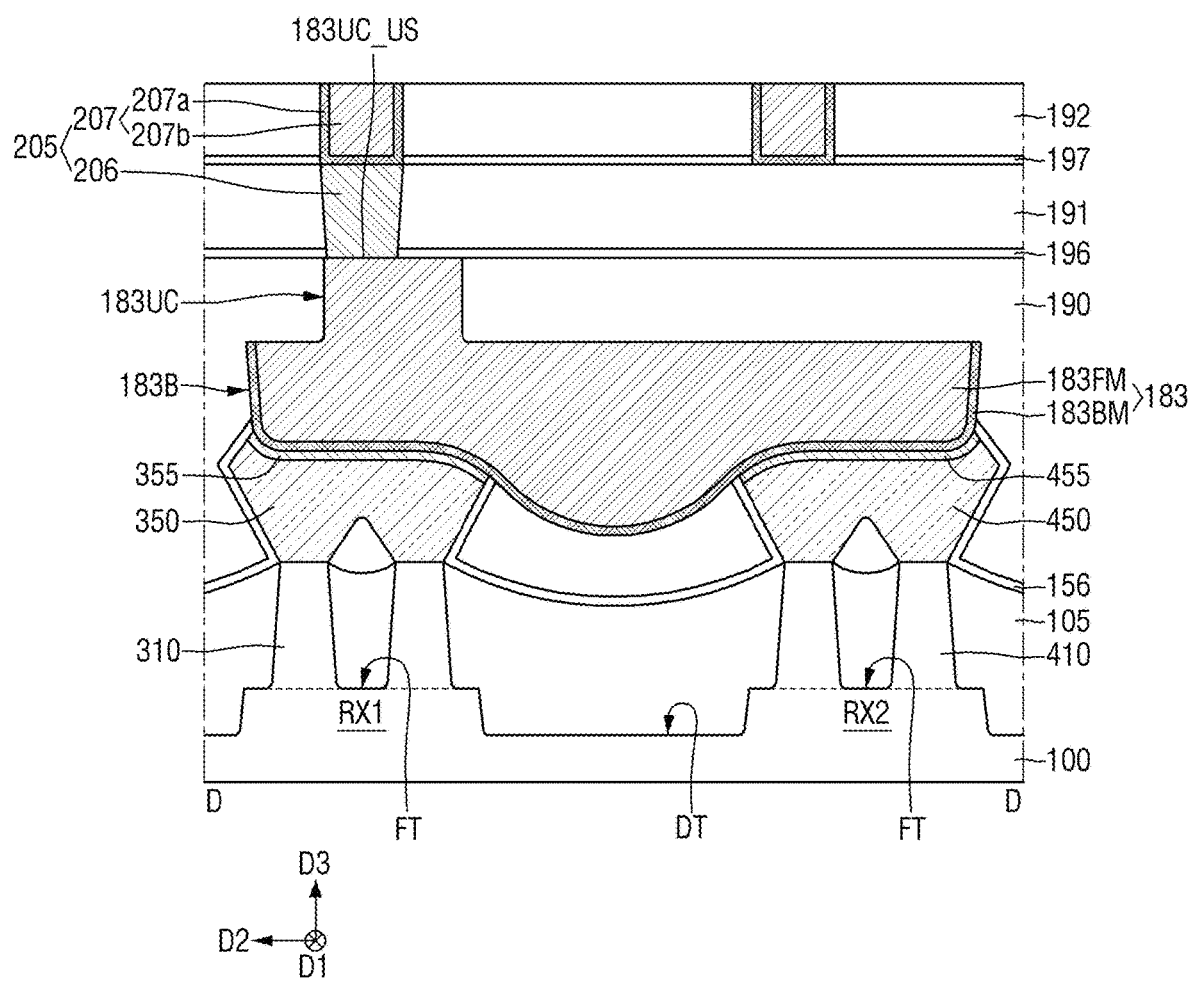

FIGS. 10 to 12 are diagrams for explaining a semiconductor device according to some embodiments. For convenience of explanation, the explanation will focus on points that are different from those explained using FIGS. 1 to 9. For reference, FIG. 10 is an exemplary layout diagram for describing a semiconductor device according to some embodiments. FIGS. 11 and 12 are cross-sectional views taken along lines C-C and D-D of FIG. 10.

Referring to FIGS. 10 to 12, a semiconductor device according to some embodiments may include a third connecting source/drain contact 183 that is closest to the first element isolation structure 165.

The third connecting source/drain contact 183 may be disposed between the first element isolation structure 165 and the gate electrode 120, 220 and 320. The first element isolation structure 165 may be disposed on one side of the third connecting source/drain contact 183, and the gate electrodes 120, 220 and 320 may be disposed on the other side of the third connecting source/drain contact 183.

The third connecting source/drain contact 183 may be a connecting source/drain contact that is closest to the first element isolation structure 165. The first element isolation structure 165 may be disposed between the third connecting source/drain contacts 183 adjacent to each other in the first direction D1. The third connecting source/drain contact 183 instead of the first connecting source/drain contact (181 of FIG. 1) may be disposed on both sides of the first element isolation structure 165.

The third connecting source/drain contact 183 may include a third lower contact region 183B and a third upper contact region 183UC.

The third lower contact region 183B may intersect the first fin-shaped pattern 110 and the second fin-shaped pattern 210. The third lower contact region 183B may be connected to the first source/drain pattern 150 and the second source/drain pattern 250 at the same time. The third lower contact region 183B may intersect the third fin-shaped pattern 310 and the fourth fin-shaped pattern 410. The third lower contact region 183B may be connected to the third source/drain pattern 350 and the fourth source/drain pattern 450 at the same time.

The third upper contact region 183UC may protrude from the third lower contact region 183B in the third direction D3. The third connecting source/drain contact 183 may include one contact region that protrudes from the third lower contact region 183B in the third direction D3. The third lower contact region 183B and the third upper contact region 183UC may have an integral structure.

The upper surface of the third connecting source/drain contact 183 may be an upper surface 183UC_US of the third upper contact region. The upper surface 183UC_US of the third upper contact region may be disposed on the same plane as the upper surface of the lower interlayer insulating film 190.

The third lower contact region 183B may include a protruding portion 183B_PR. The protruding portion 183B_PR of the third lower contact region may be a portion that protrudes from the third upper contact region 183UC in the second direction D2. The third upper contact region 183UC may be disposed between the protruding portions 183B_PR of the third lower contact region.

The third upper contact region 183UC may be a portion on which the via plug 206 lands. The third connecting source/drain contact 183 may be connected with the wiring structure 205 through the third upper contact region 183UC. The wiring structure 205 may contact the upper surface 183UC_US of the third upper contact region.

In FIG. 11, the third lower contact region 183B may include a third downward protruding region 183_DP protruding toward the substrate 100, between the first source/drain pattern 150 and the second source/drain pattern 250. The third connecting source/drain contacts 183 may include a third source/drain barrier film 183BM and a third source/drain filling film 183FM.

From a viewpoint of plan view, the gate contacts 176, 177 and 178 connected to the gate electrodes 120, 220 and 320 closest to the third connecting source/drain contact 183 do not overlap the third upper contact region 183UC in the first direction D1. In the semiconductor device according to some embodiments, the gate isolation structure 160 between the first gate electrode 120 and the second gate electrode 220 closest to the third connecting source/drain contact 183 does not overlap the third upper contact region 183UC in the first direction D1.

The via plug 206 penetrates the first etch stop film 196 and the first upper interlayer insulating film 191, and may be connected to the third connecting source/drain contact 183. The via plug 206 comes into contact with the upper surface 183UC_US of the third upper contact region.

In FIG. 11, the bottom surface 206BS of the via plug may have a second via width W32 in the second direction D2. A width W31 of the upper surface 183UC_US of the third upper contact region in the second direction D2 may be greater than or equal to 1.5 times the second via width W32. The second via width W32 may be the same as the first via width W22 of FIG. 9. The width W31 of the upper surface 183UC_US of the third upper contact region in the second direction D2 is smaller than the width of the third lower contact region 183B in the second direction D2. In the third connecting source/drain contact 183 connected to the third source/drain pattern 350 and the fourth source/drain pattern 450, the width of the upper surface 183UC_US of the third upper contact region in the second direction D2 may be greater than or equal to 1.5 times the second via width (W32 of FIG. 11).

Figure 13:
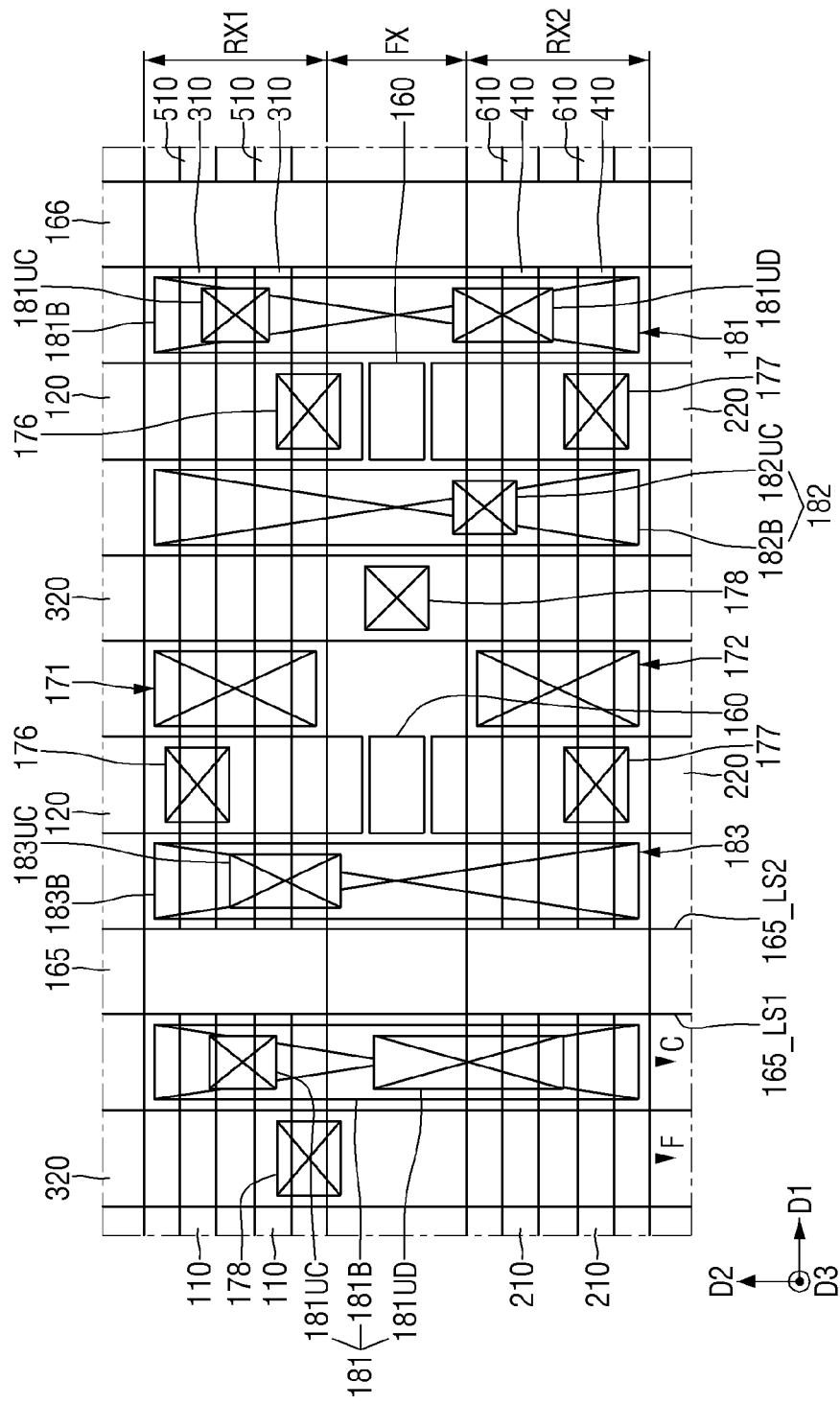
FIG. 13 is a layout diagram of a semiconductor device according to some embodiments.

FIG. 13 is an exemplary layout diagram for explaining a semiconductor device according to some embodiments. For convenience of explanation, the explanation will focus on points that are different from those explained using FIGS. 1 to 12.

Referring to FIG. 13, in a semiconductor device according to some embodiments, a first element isolation structure 165 may be disposed between the first connecting source/drain contact 181 and the third connecting source/drain contact 183. The first connecting source/drain contact 181 disposed on one side of the first element isolation structure 165 includes a first dummy contact region 181UD. However, the third connecting source/drain contact 183 disposed on the other side of the first element isolation structure 165 does not include a dummy contact region.

Figure 14:
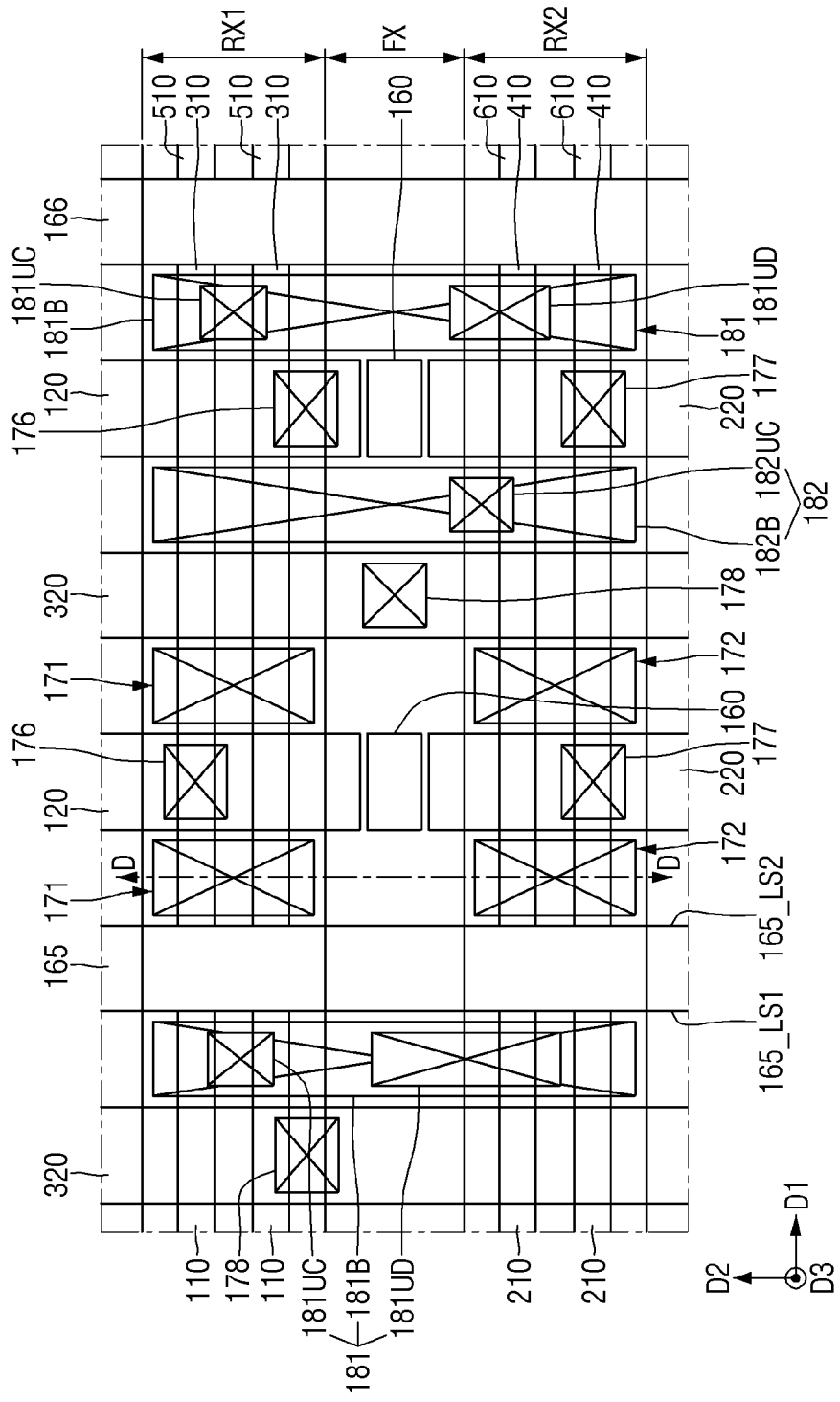
FIGS. 14 and 15 are diagrams of a semiconductor device according to some embodiments.

FIGS. 14 and 15 are diagrams for explaining a semiconductor device according to some embodiments. For convenience of explanation, the explanation will focus on points that are different from those explained using FIGS. 1 to 9. For reference, FIG. 14 is an exemplary layout diagram for describing a semiconductor device according to some embodiments. FIG. 15 is a cross-sectional view taken along line D-D of FIG. 14.

Referring to FIGS. 14 and 15, in the semiconductor device according to some embodiments, the first element isolation structure 165 may be disposed between the first connecting source/drain contact 181 and the first source/drain contact 171, and between the first connecting source/drain contact 181 and the second source/drain contact 172.

The first source/drain contact 171 and the second source/drain contact 172 may be disposed closest to the first element isolation structure 165. The first connecting source/drain contact 181 may be disposed on one side of the first element isolation structure 165. The first source/drain contact 171 and the second source/drain contact 172 may be disposed on the other side of the first element isolation structure 165.

The first source/drain contact 171 may include a first single lower contact region 171B and a first single upper contact region 171UC. The second source/drain contact 172 may include a second single lower contact region 172B and a second single upper contact region 172UC. The first source/drain contact 171 and the second source/drain contact 172 include one contact region that protrudes from the single lower contact regions 171B and 172B in the third direction D3.

The first single lower contact region 171B is connected to the third source/drain pattern 350, but is not connected to the fourth source/drain pattern 450. The second single lower contact region 172B is connected to the fourth source/drain pattern 450, but is not connected to the third source/drain pattern 350.

The first single upper contact region 171UC may protrude from the first single lower contact region 171B in the third direction D3. The second single upper contact region 172UC may protrude from the second single lower contact region 172B in the third direction D3.

The first source/drain contact 171 may include a first single source/drain barrier film 171BM and a first single source/drain filling film 171FM. The second source/drain contact 172 may include a second single source/drain barrier film 172BM and a second single source/drain filling film 172FM.

From a viewpoint of a plan view, the gate contacts 176, 177 and 178 connected to the gate electrodes 120, 220 and 320 closest to the first element isolation structure 165 do not overlap the first single upper contact region 171UC and the second single upper contact region 172UC in the first direction D1. The via plug 206 is connected to the first source/drain contact 171 and the second source/drain contact 172.

Figure 16:
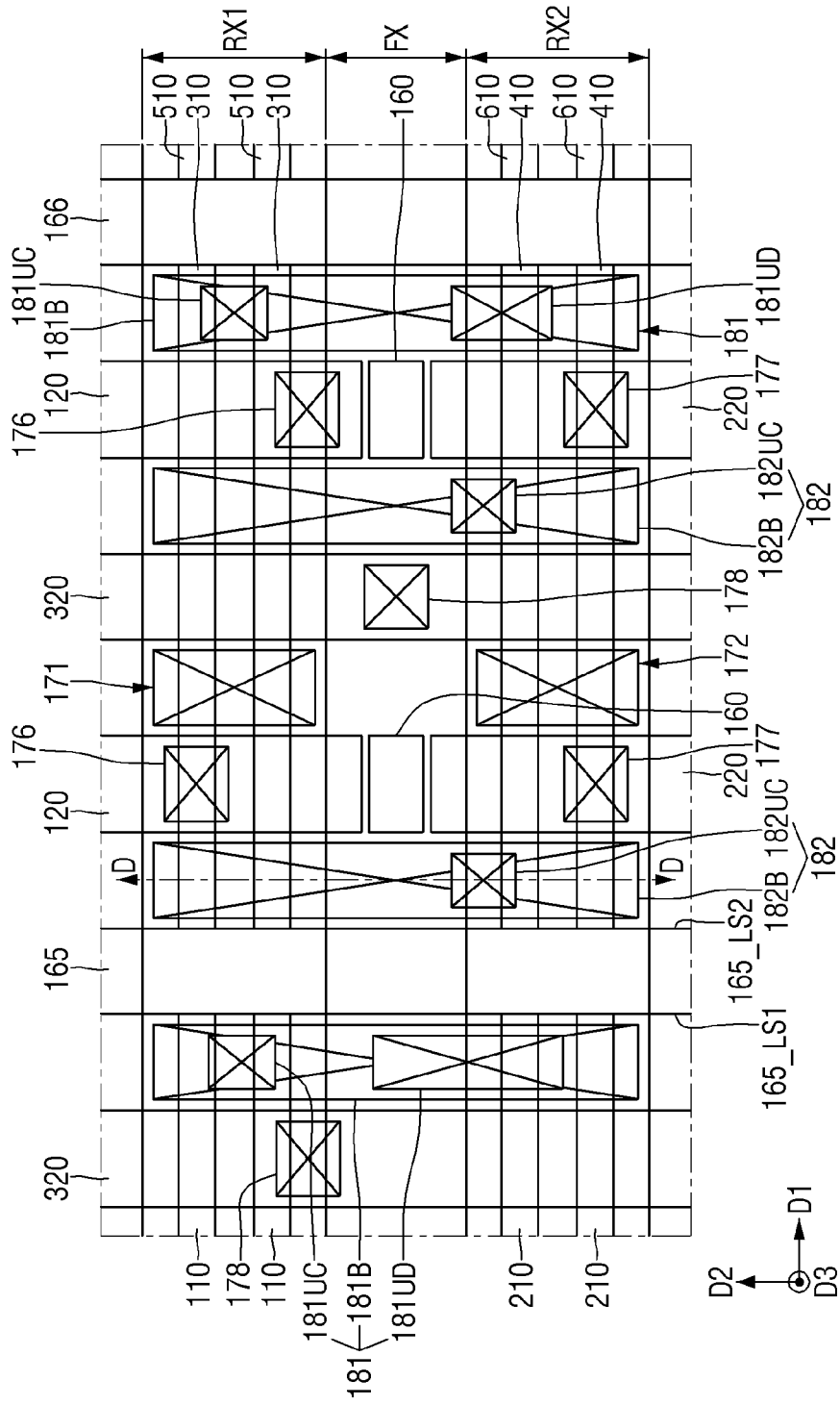
FIGS. 16 and 17 are diagrams of a semiconductor device according to some embodiments.
Figure 17:
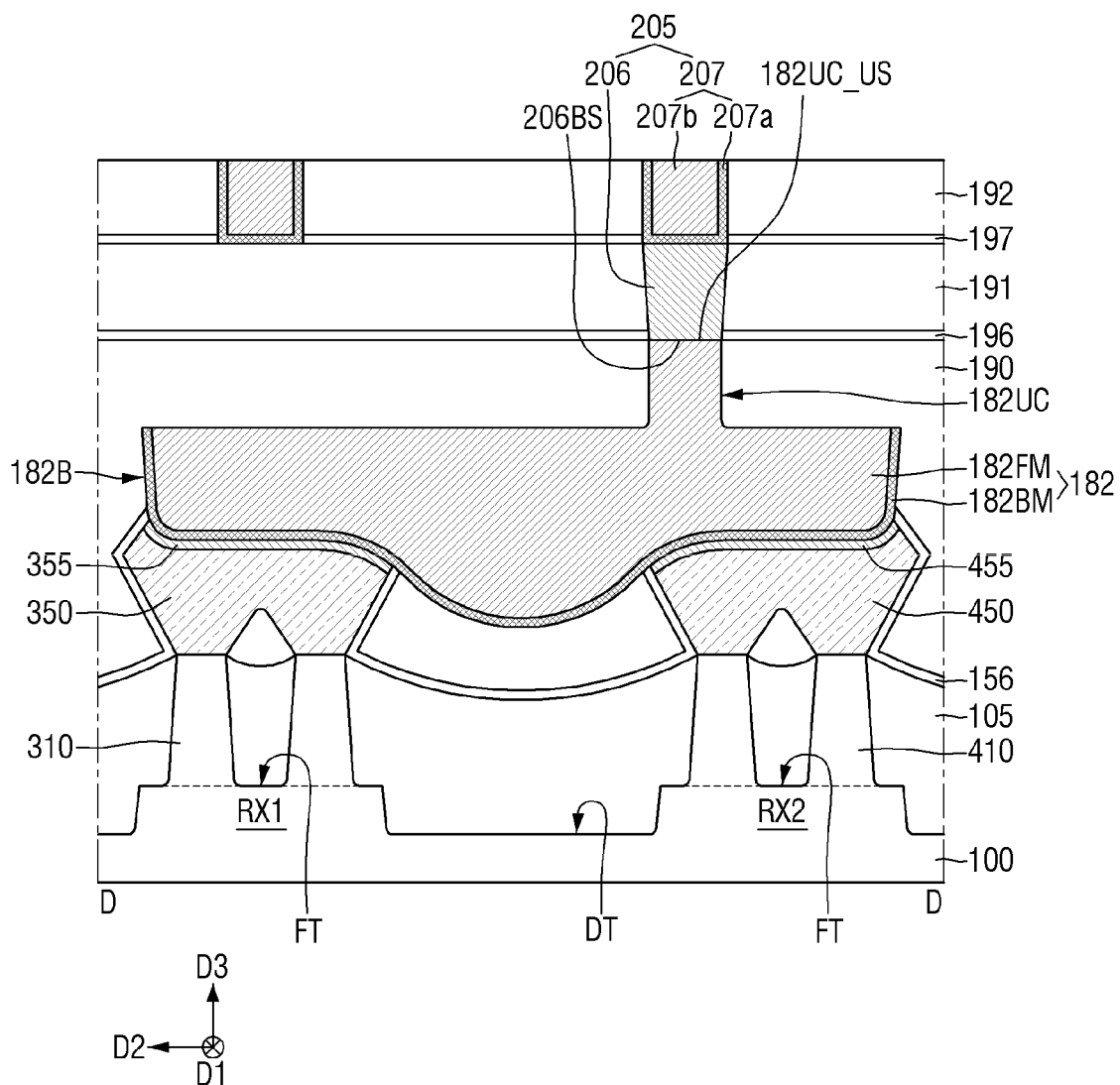

FIGS. 16 and 17 are diagrams for explaining a semiconductor device according to some embodiments. For convenience of explanation, the explanation will focus on points that are different from those explained using FIGS. 1 to 9. For reference, FIG. 16 is an exemplary layout diagram for describing a semiconductor device according to some embodiments. FIG. 17 is a cross-sectional view taken along line D-D of FIG. 16.

Referring to FIGS. 16 and 17, in the semiconductor device according to some embodiments, a first element isolation structure 165 may be disposed between the first connecting source/drain contact 181 and the second connecting source/drain contact 182. The second connecting source/drain contact 182 may be disposed closest to the first element isolation structure 165. The first connecting source/drain contact 181 may be disposed on one side of the first element isolation structure 165. The second connecting source/drain contact 182 may be disposed closest to the other side of the first element isolation structure 165.

Figure 18:
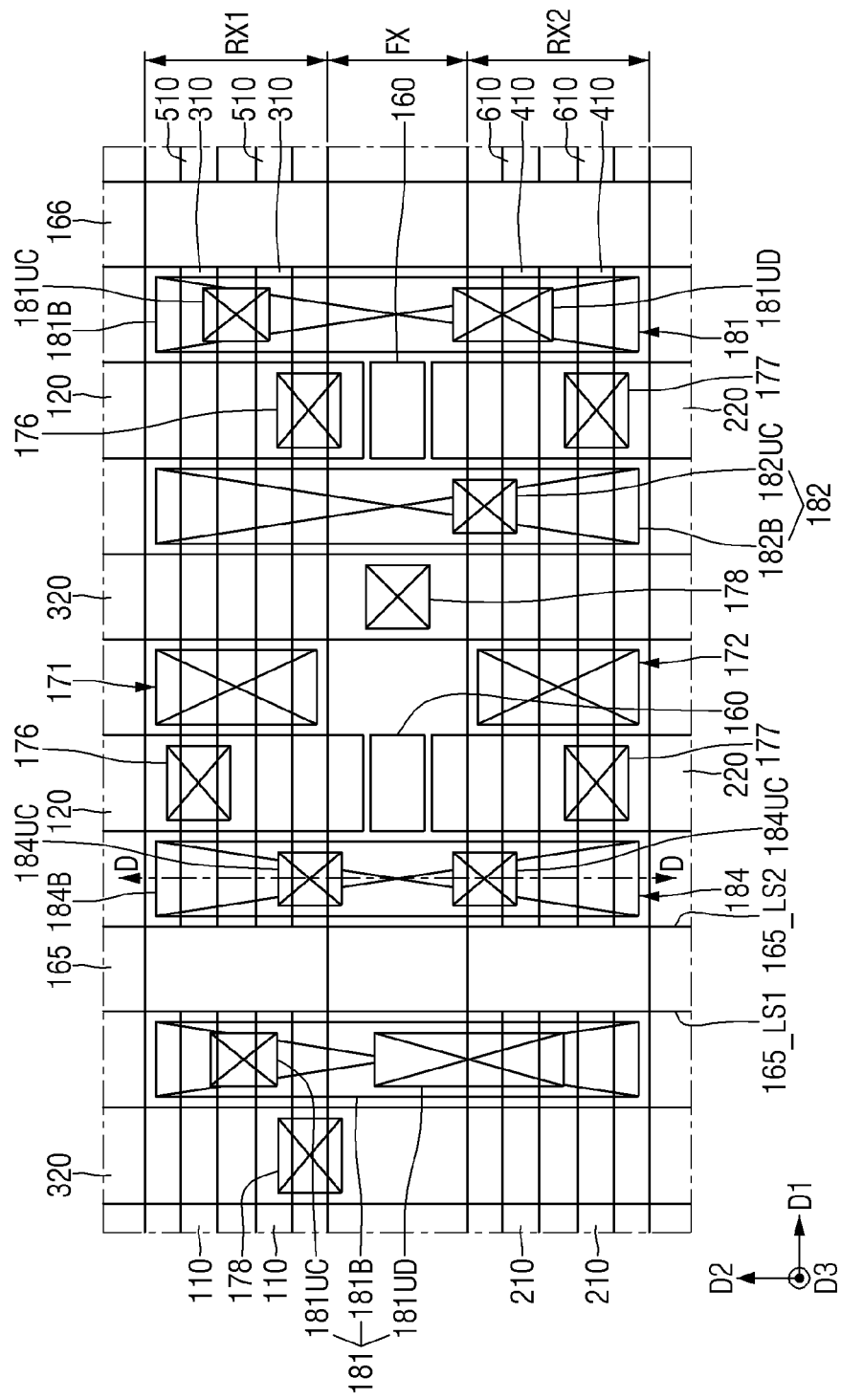
FIGS. 18 and 19 are diagrams of a semiconductor device according to some embodiments.
Figure 19:
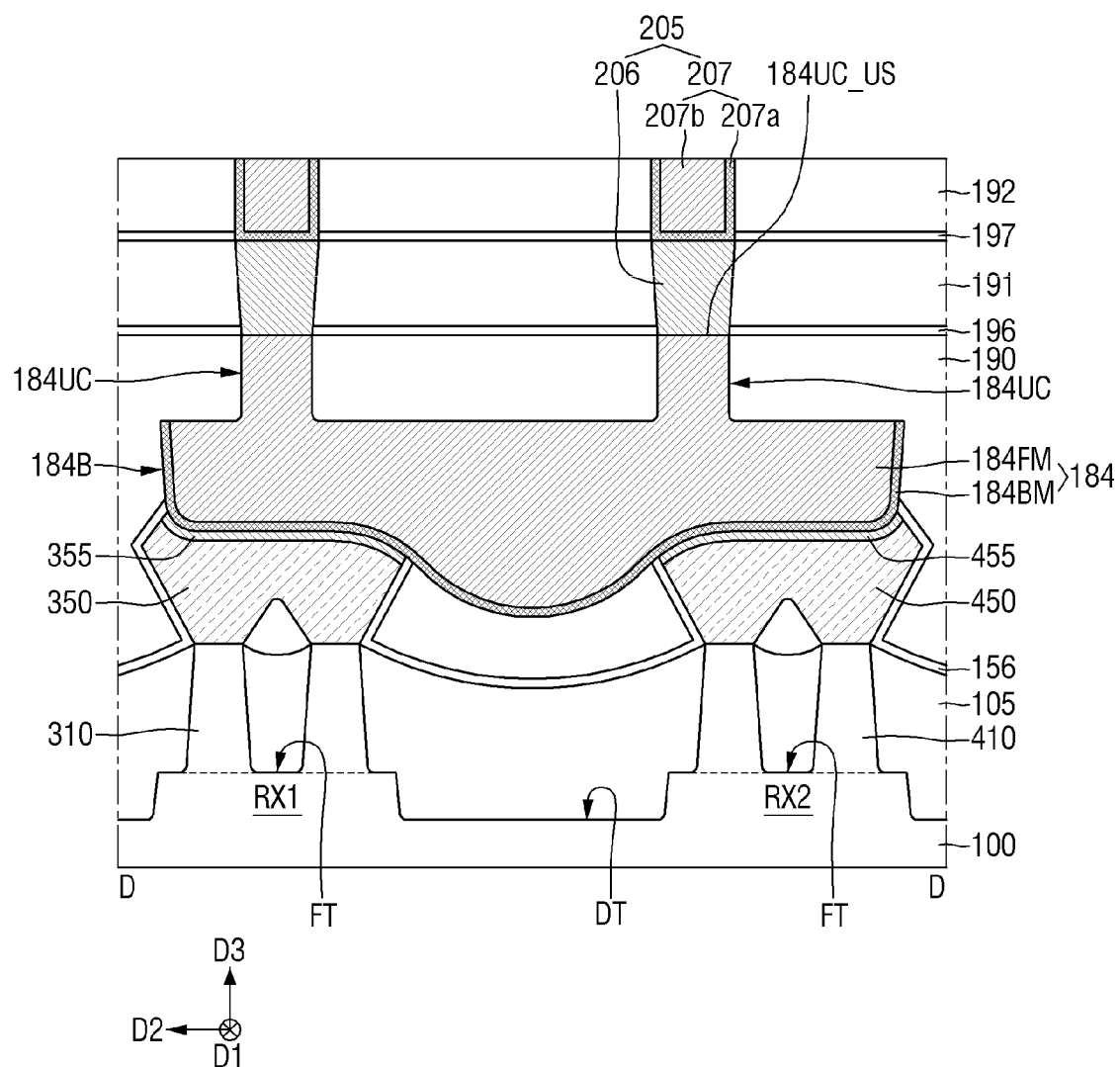

FIGS. 18 and 19 are diagrams for explaining a semiconductor device according to some embodiments. For convenience of explanation, the explanation will focus on points that are different from those explained using FIGS. 1 to 9. For reference, FIG. 18 is an exemplary layout diagram for describing a semiconductor device according to some embodiments. FIG. 19 is a cross-sectional view taken along line D-D of FIG. 18.

Referring to FIGS. 18 and 19, in the semiconductor device according to some embodiments, a first element isolation structure 165 may be disposed between the first connecting source/drain contact 181 and a fourth connecting source/drain contact 184. The fourth connecting source/drain contact 184 may include a fourth lower contact region 184B and a plurality of fourth upper contact regions 184UC.

The fourth lower contact region 184B may intersect the third fin-shaped pattern 310 and the fourth fin-shaped pattern 410. The fourth lower contact region 184B may be connected to the third source/drain pattern 350 and the fourth source/drain pattern 450 at the same time.

The plurality of fourth upper contact regions 184UC may protrude from the, e.g., same, fourth lower contact region 184B in the third direction D3. The plurality of fourth upper contact regions 184UC may be spaced apart from each other in the second direction D2.

Each fourth upper contact region 184UC may be a portion on which the via plug 206 lands. The fourth connecting source/drain contacts 184 are connected with the wiring structure 205 through the respective fourth upper contact regions 184UC. The wiring structure 205 comes into contact with the upper surface 184UC_US of each fourth upper contact region. The plurality of fourth upper contact regions 184UC may include a first sub-contact region and a second sub-contact region that are spaced apart from each other in the second direction D2. The first sub-contact region and the second sub-contact region may each come into contact with the via plug 206. An upper surface of the first sub-contact region and an upper surface of the second sub-contact region may come into contact with the wiring structure 205.

For example, the fourth connecting source/drain contact 184 may be a connecting source/drain contact that is closest to the first element isolation structure 165. The fourth connecting source/drain contact 184 may include a fourth source/drain barrier film 184BM and a fourth source/drain filling film 184FM.

Figure 20:
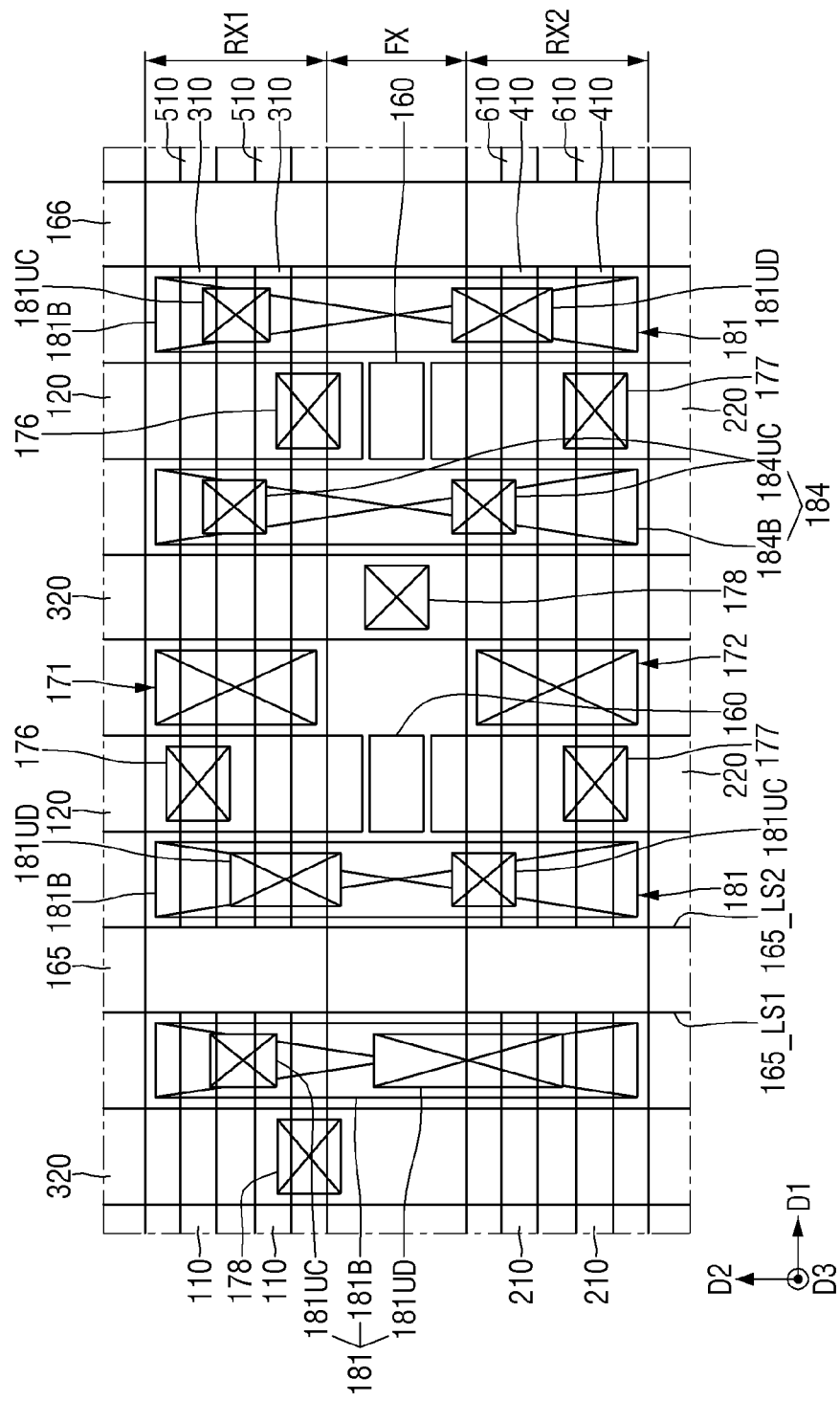
FIG. 20 is a layout diagram of a semiconductor device according to some embodiments.

FIG. 20 is an exemplary layout diagram for explaining a semiconductor device according to some embodiments. FIGS. 21 to 25 are diagrams for explaining a semiconductor device according to some embodiments. For convenience of explanation, the explanation will focus on points that are different from those explained using FIGS. 1 to 9. For reference, FIGS. 21 to 24 are cross-sectional views taken along line C-C of FIG. 1. FIG. 25 is a cross-sectional view taken along line G-G of FIG. 1.

Referring to FIG. 20, in a semiconductor device according to some embodiments, a fourth connecting source/drain contact 184 may be disposed between the gate electrodes 120, 220 and 320 adjacent to each other in the first direction. For example, the fourth connecting source/drain contact 184 may not be a connecting source/drain contact that is closest to the element isolation structures 165 and 166. The description of the structure of the fourth connecting source/drain contact 184 may be the same as that described using FIGS. 18 and 19.

Figure 21:
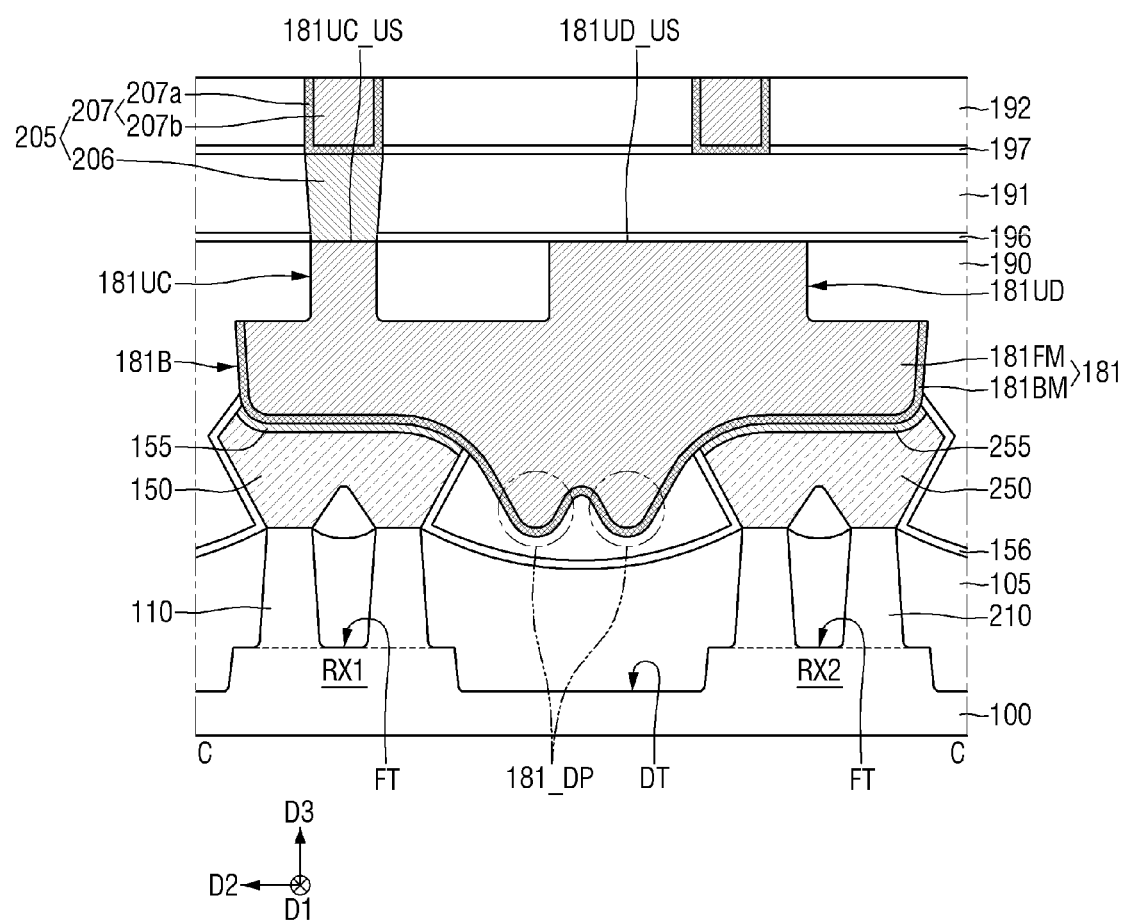
FIGS. 21 to 25 are diagrams of a semiconductor device according to some embodiments.

Referring to FIG. 21, in the semiconductor device according to some embodiments, the first lower contact region 181B may include a plurality of first downward protruding regions 181_DP that protrude toward the substrate 100, between the first source/drain pattern 150 and the second source/drain pattern 250. For example, the first lower contact region 181B may include two first downward protruding regions 181_DP.

Unlike that shown, at least one of the plurality of first downward protruding regions 181_DP may come into contact with the source/drain etch stop film 156 or the field insulating film 105. Also, unlike that shown, a part of the field insulating film 105 may protrude between the first downward protruding regions 181_DP adjacent to each other in the second direction D2. Although not shown, the second lower contact region (182B of FIG. 6) may also include a plurality of downward protruding regions.

Figure 22:
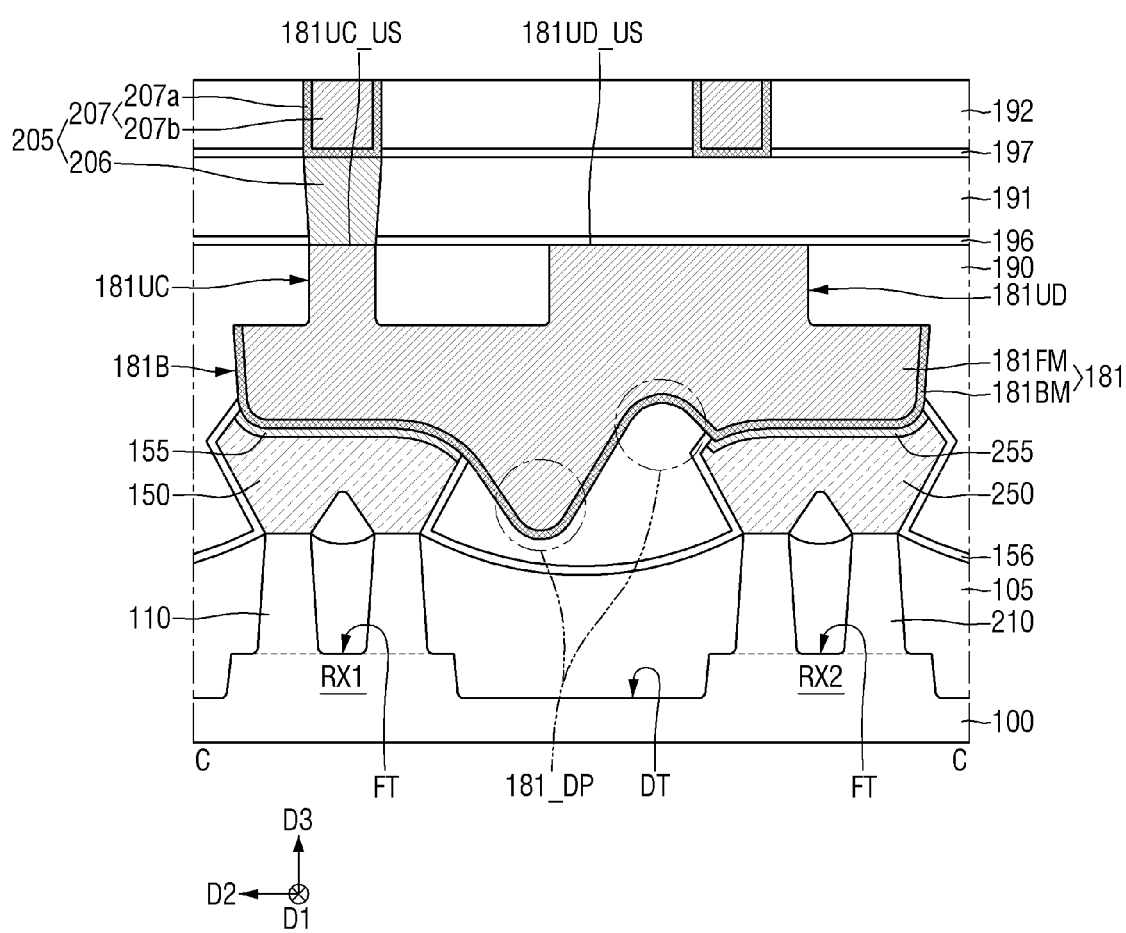

Referring to FIG. 22, in a semiconductor device according to some embodiments, the first lower contact region 181B may include one first downward protruding region 181_DP and one first upward indented region 181_UP. A part of the lower interlayer insulating film 190 may be indented into the first lower contact region 181B. In the first upward indented region 181_UP, the lower interlayer insulating film 190 may be indented into the first lower contact region 181B.

In the first downward protruding region 181_DP, the thickness of the first lower contact region 181B in the third direction D3 may increase and then decrease, as it goes away from the first source/drain pattern 150. In the first upward indented region 181_UP, the thickness of the first lower contact region 181B in the third direction D3 may decrease and then increase.

Figure 23:
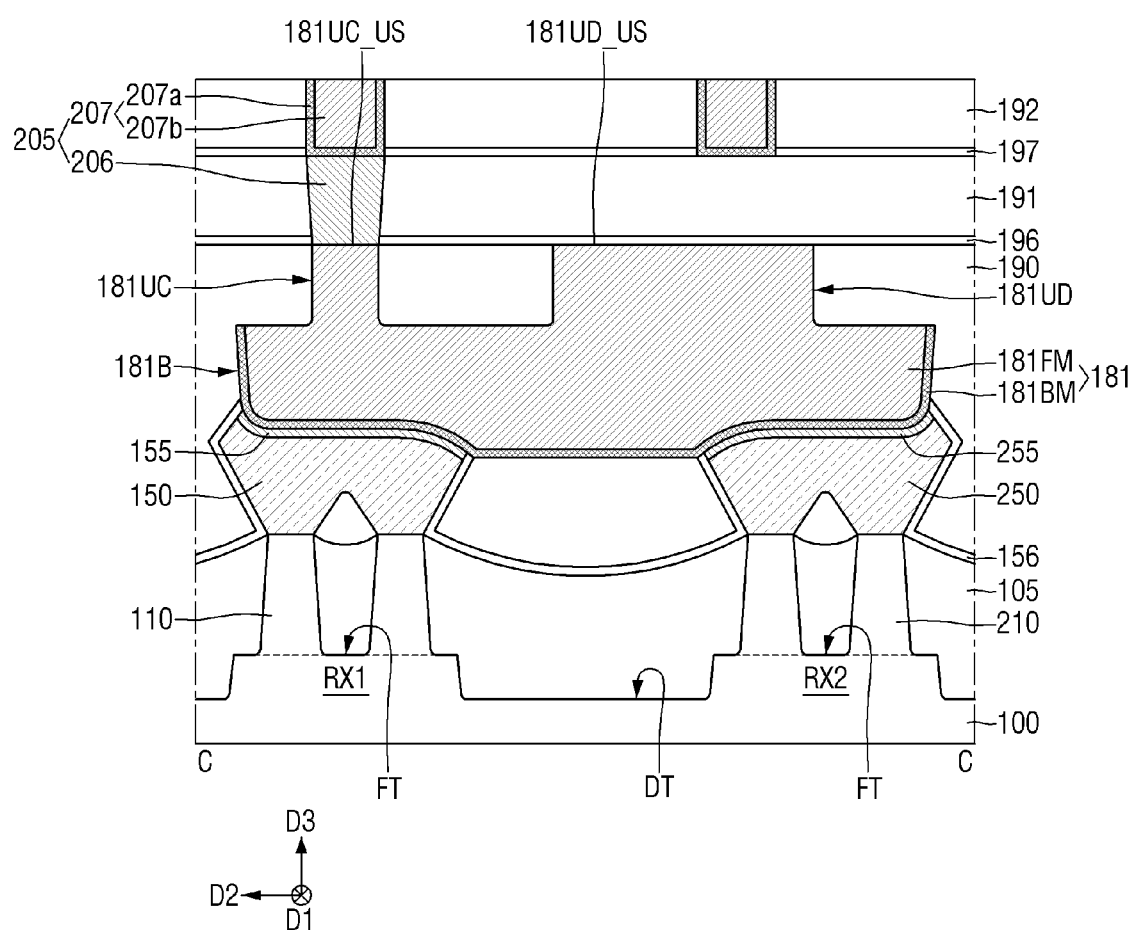

Referring to FIG. 23, in the semiconductor device according to some embodiments, the bottom surface of the first lower contact region 181B may be flat between the first source/drain pattern 150 and the second source/drain pattern 250. That is, the first lower contact region 181B may not include the first downward protruding region (181_DP of FIG. 4).

Figure 24:
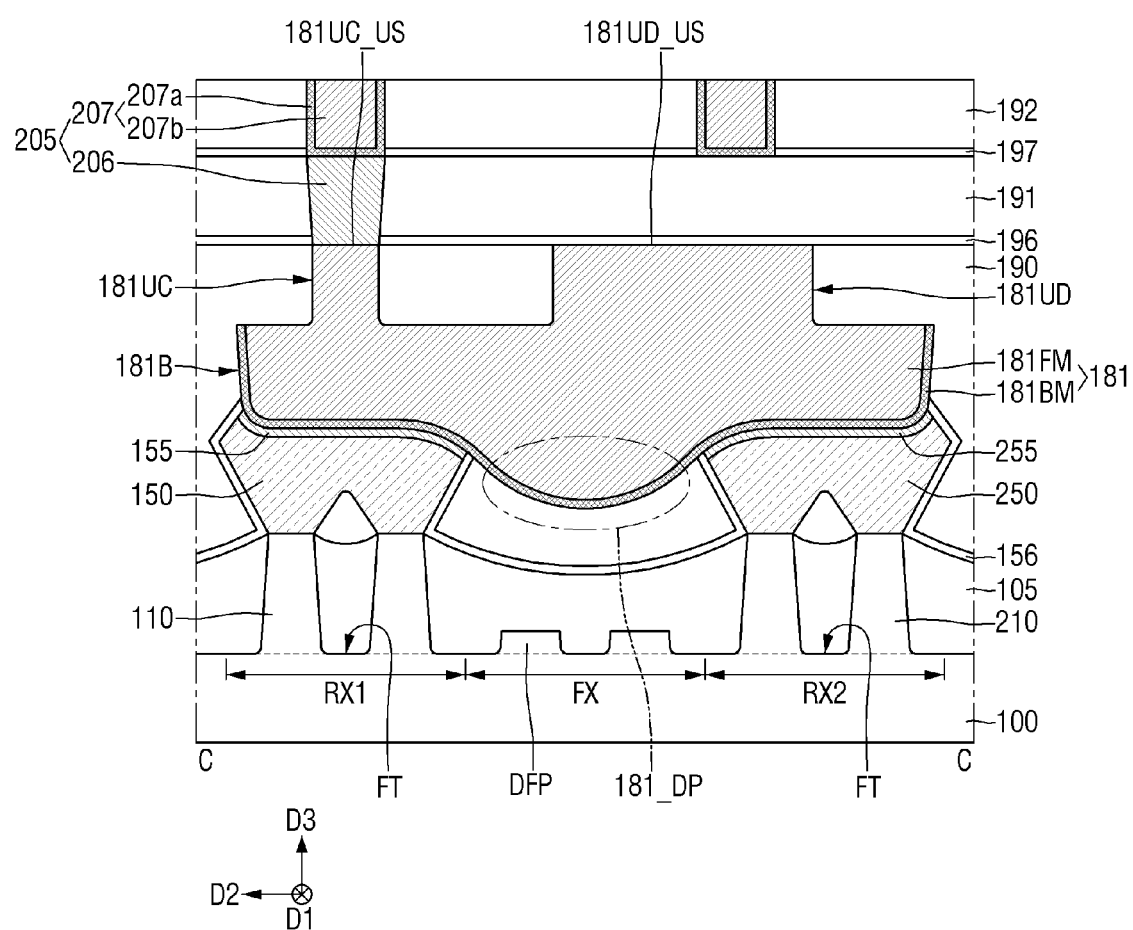
Figure 25:
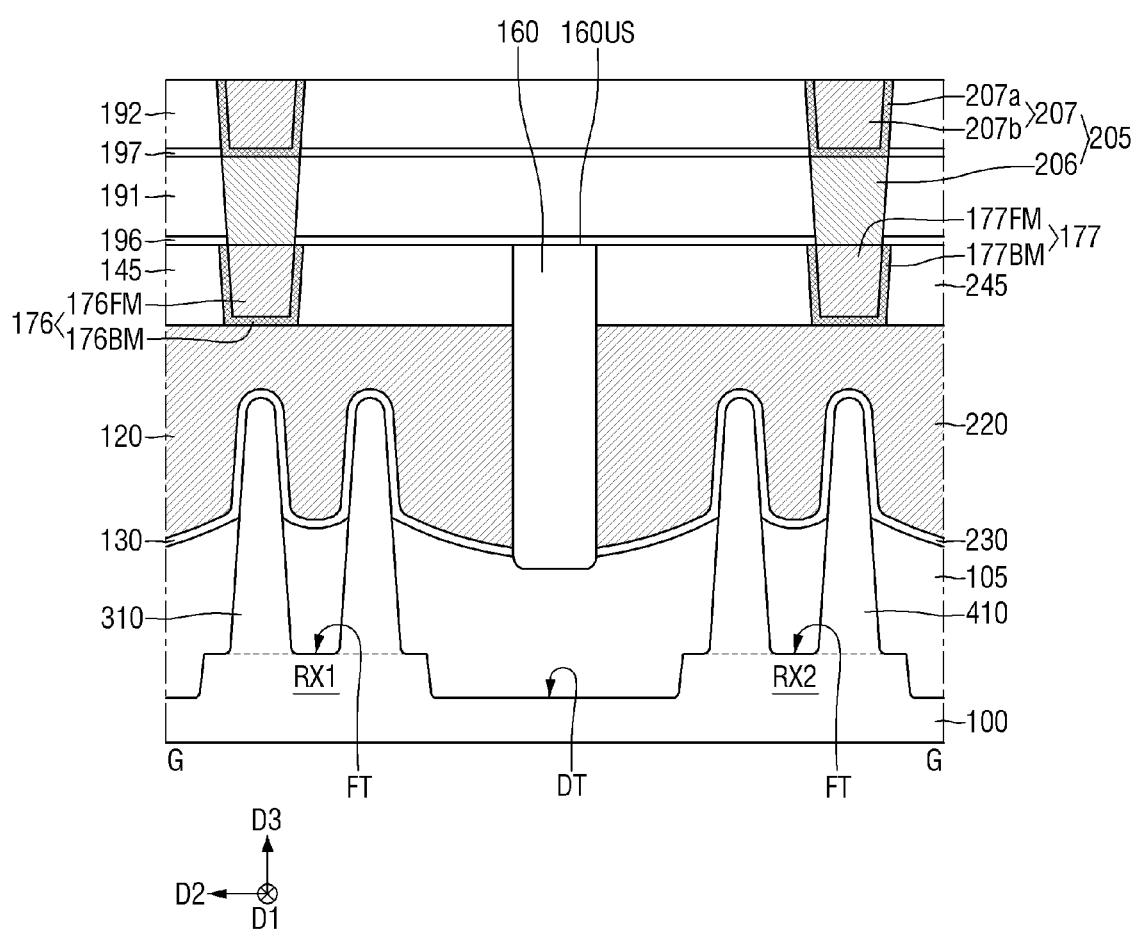

Referring to FIG. 24, in a semiconductor device according to some embodiments, the field region FX may be defined by a dummy fin pattern DFP. The first active region RX1 and the second active region RX2 may be defined by the dummy fin pattern DFP.

Alternatively, the first active region RX1 and the second active region RX2 may be defined between the dummy fin patterns DFP. The upper surface of the dummy fin pattern DFP may be entirely covered with the field insulating film 105. The upper surface of the dummy fin pattern DFP is lower than the upper surface of the field insulating film 105. The dummy fin pattern DFP may include, e.g., the same material as the first fin-shaped pattern 110 and/or the second fin-shaped pattern 210.

Referring to FIG. 25, in the semiconductor device according to some embodiments, the first gate insulating film 130 does not extend along the sidewalls of the first gate electrode 120 and the sidewalls of the gate isolation structure 160 that face each other in the second direction D2. The second gate insulating film 230 does not extend along the sidewalls of the second gate electrode 220 and the sidewalls of the gate isolation structure 160 that face each other in the second direction D2.

In such a case, the gate isolation structure 160 between the first gate electrode 120 and the second gate electrode 220 closest to the first connecting source/drain contact 181 may overlap the first upper contact region (181UC of FIG. 1) and the first dummy contact region (181UD of FIG. 1) in the first direction D1. Also, the gate isolation structure 160 between the first gate electrode 120 and the second gate electrode 220 closest to the second connecting source/drain contact (182 of FIG. 1) may overlap the second upper contact region (182UC of FIG. 1) in the first direction D1.

Figure 26:
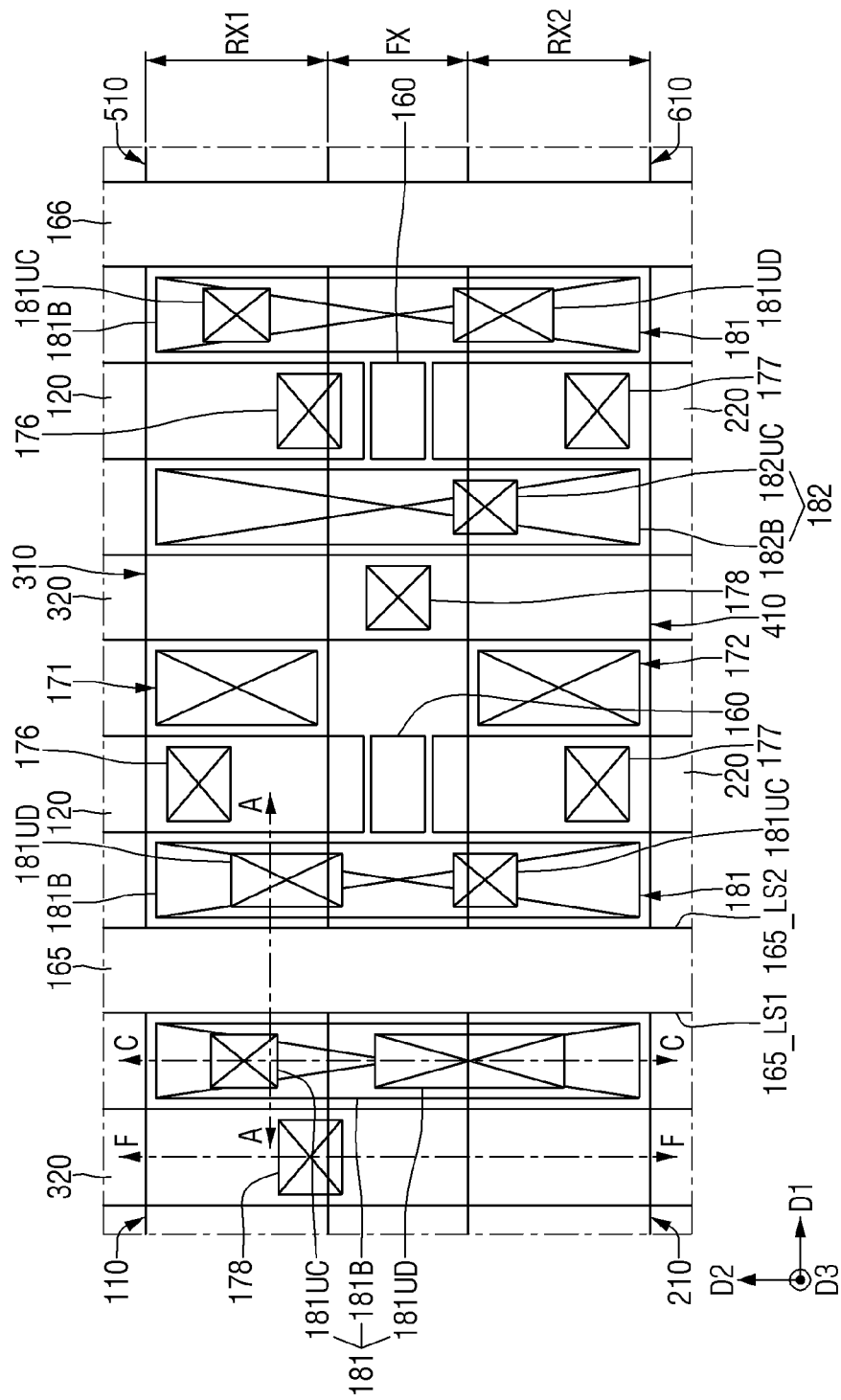
FIGS. 26 to 30 are diagrams of a semiconductor device according to some embodiments.
Figure 27:
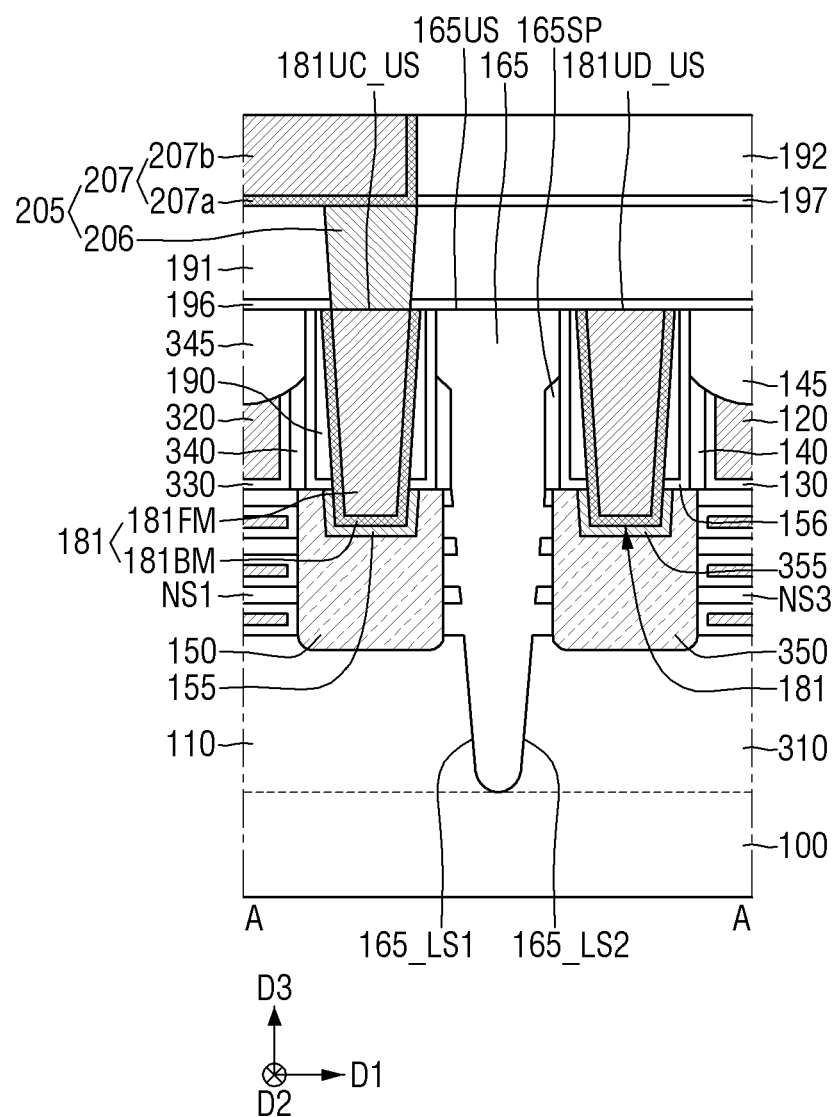
Figure 28:
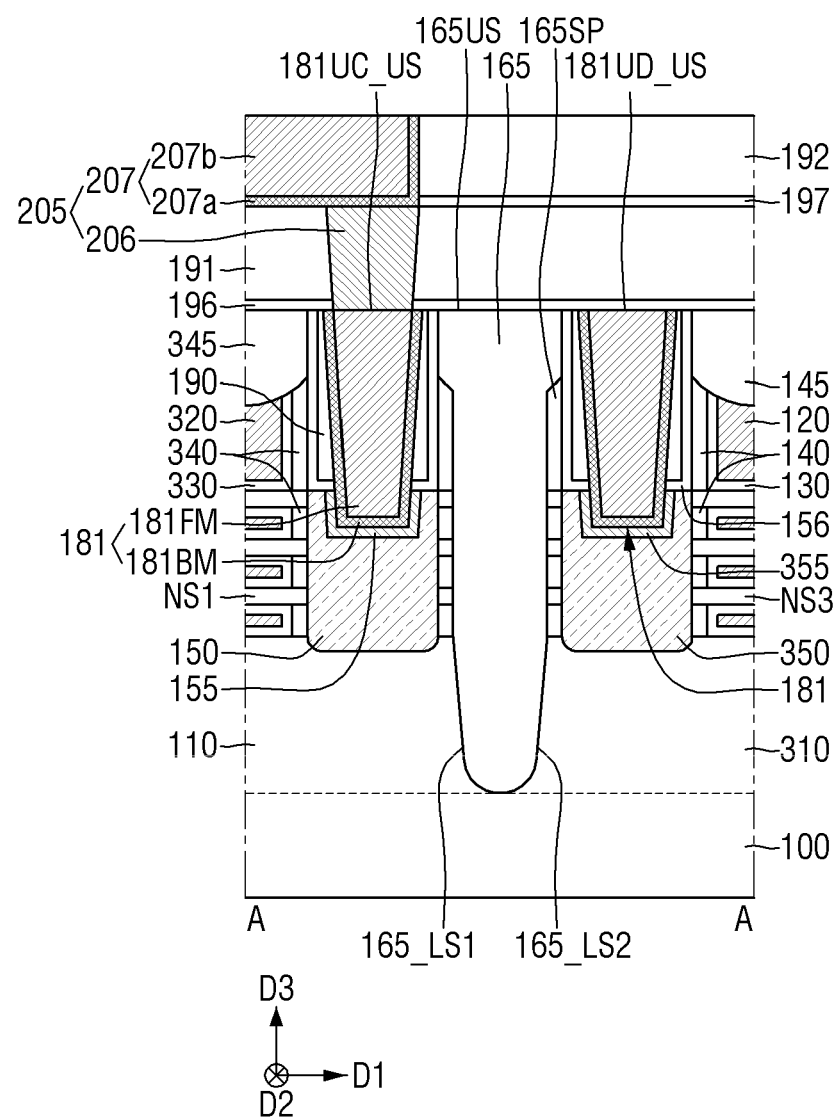
Figure 29:
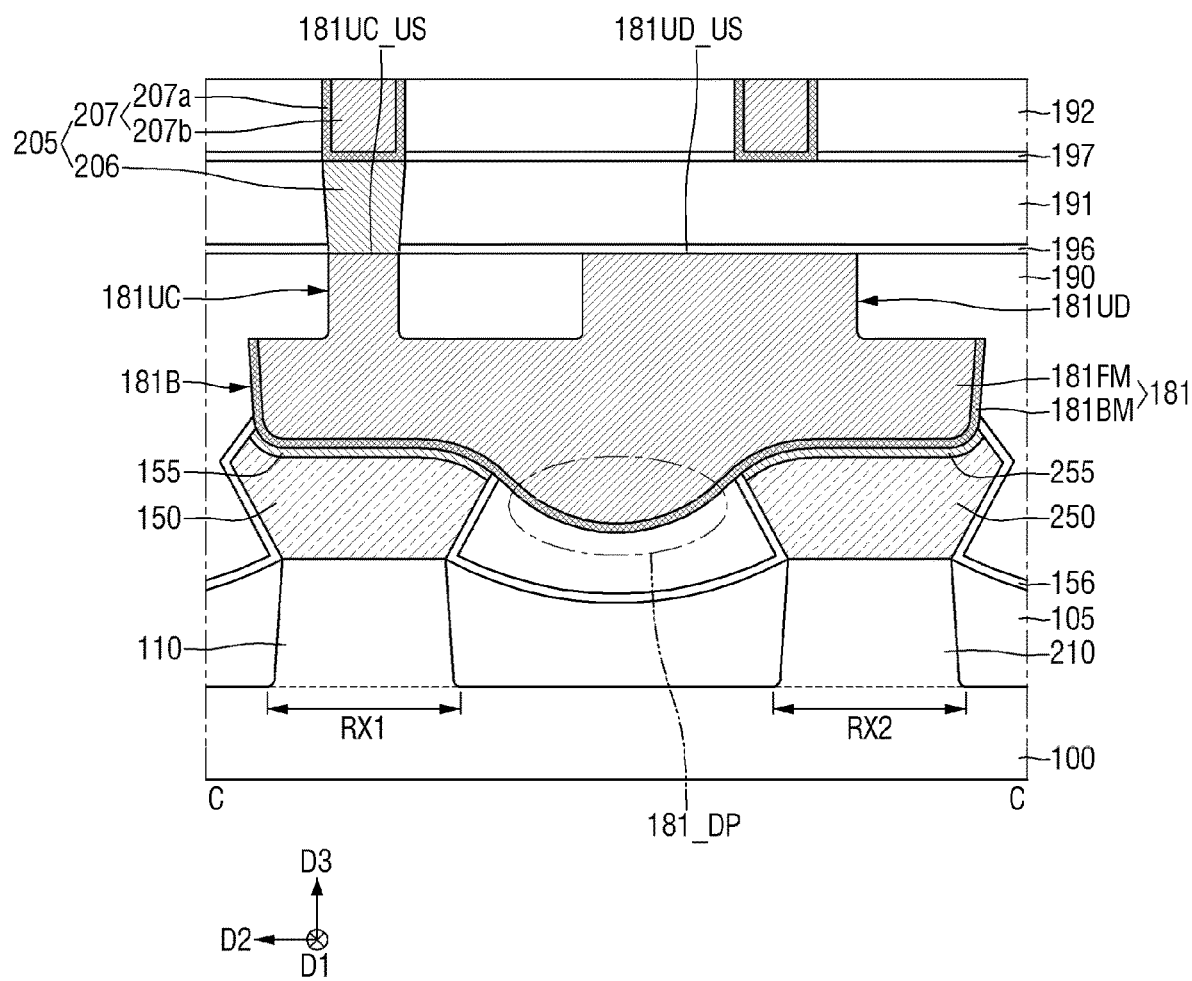
Figure 30:
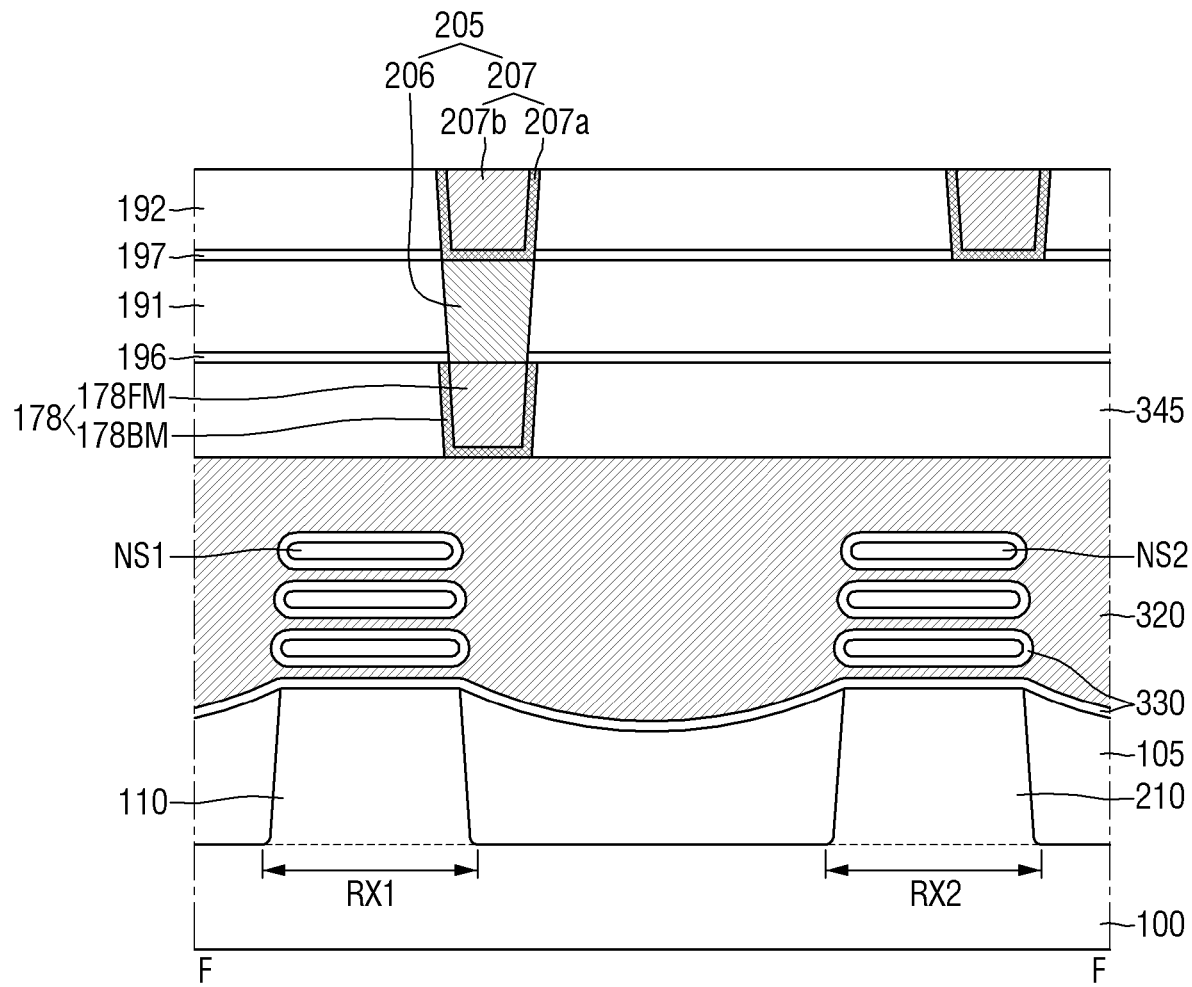
Figure 30:
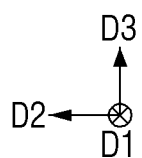

FIGS. 26 to 30 are diagrams for explaining a semiconductor device according to some embodiments. FIG. 26 is an exemplary layout diagram for explaining a semiconductor device according to some embodiments. FIGS. 27 and 28 are cross-sectional views taken along line A-A of FIG. 26. FIG. 29 is a cross-sectional view taken along line C-C of FIG. 26. FIG. 30 is a cross-sectional view taken along line F-F of FIG. 26. For convenience of explanation, the explanation will focus on points that are different from those explained using FIGS. 1 to 9.

Referring to FIGS. 26 to 30, a semiconductor device according to some embodiments may further include a first sheet pattern NS1 spaced apart from the first fin-shaped pattern 110 in the third direction D3, a second sheet pattern NS2 spaced apart from the second fin-shaped pattern 210 in the third direction D3, and a third sheet pattern NS3 spaced apart from the third fin-shaped pattern 310 in the third direction D3. Although not shown, a sheet pattern may be disposed on each of the fin-shaped patterns 410, 510 and 610 of FIGS. 4 to 6.

The first active region RX1 and the second active region RX2 may be divided by the first fin-shaped pattern 110 and the second fin-shaped pattern 210. Also, the first active region RX1 and the second active region RX2 may be divided by the third fin-shaped pattern 310 and the fourth fin-shaped pattern 410.

The first sheet pattern NS1 may be disposed on the first fin-shaped pattern 110 to be spaced apart from the first fin-shaped pattern 110. The first sheet pattern NS1 may include a plurality of sheet patterns. The second sheet pattern NS2 may be disposed on the second fin-shaped pattern 210 to be spaced apart from the second fin-shaped pattern 210. The second sheet pattern NS2 may include a plurality of sheet patterns. The third sheet pattern NS3 may be disposed on the third fin-shaped pattern 310 to be spaced apart from the third fin-shaped pattern 310. Although three of each of the first sheet patterns NS1, the second sheet patterns NS2, and the third sheet patterns NS3 are shown, this is merely for convenience of explanation.

The first gate insulating film 130 may wrap around the third sheet pattern NS3. The third gate insulating film 330 may wrap around the first sheet pattern NS1 and the second sheet pattern NS2.

The first gate electrode 120 may be disposed on the third fin-shaped pattern 310. The first gate electrode 120 may intersect the third fin-shaped pattern 310. The first gate electrode 120 may surround the third sheet pattern NS3.

The third gate electrode 320 may be disposed on the first fin-shaped pattern 110 and the second fin-shaped pattern 210. The third gate electrode 320 may intersect the first fin-shaped pattern 110 and the second fin-shaped pattern 210. The third gate electrode 320 may surround the first sheet pattern NS1 and the second sheet pattern NS2.

In FIG. 27, the first gate spacer 140 may not be disposed between the third fin-shaped pattern 310 and the third sheet pattern NS3, and between the adjacent third sheet patterns NS3. Also, the third gate spacer 340 may not be disposed between the first fin-shaped pattern 110 and the first sheet pattern NS1, and between the adjacent first sheet patterns NS1.

In FIG. 28, the first gate spacer 140 may be disposed between the third fin-shaped pattern 310 and the third sheet pattern NS3, and between the adjacent third sheet patterns NS3. The third gate spacer 340 may be disposed between the first fin-shaped pattern 110 and the first sheet pattern NS1, and between the adjacent first sheet patterns NS1. A cross-sectional view taken along the second fin-shaped pattern 210 may be similar to one of FIGS. 29 and 30.

The first source/drain pattern 150 may be connected to the first sheet pattern NS1 adjacent in the first direction D1. The third source/drain pattern 350 may be connected to the third sheet pattern NS3 adjacent in the first direction D1. Although not shown, the second source/drain pattern 250 may be connected to the second sheet pattern NS2 adjacent in the first direction D1.

By way of summation and review, aspects of the present disclosure provide a semiconductor device having improved reliability and performance. That is, according to embodiments, in order to prevent a long source/drain contact from being disconnected during its fabrication, a dummy contact area not connected to the wiring may be added or a width of the contact region connected to the wiring may be larger than a width of the bottom surface of a via.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   an element isolation structure having a first sidewall and a second sidewall extending in a first direction, the first sidewall being opposite to the second sidewall in a second direction;
   a first fin-shaped pattern in contact with the first sidewall of the element isolation structure, the first fin-shaped pattern extending in the second direction;
   a second fin-shaped pattern in contact with the first sidewall of the element isolation structure, the second fin-shaped pattern extending in the second direction and being spaced apart from the first fin-shaped pattern in the first direction;
   a first gate electrode extending in the first direction and disposed on the first fin-shaped pattern;
   a first source/drain contact disposed on the first fin-shaped pattern and the second fin-shaped pattern, the first source/drain contact extending in the first direction and disposed between the first gate electrode and the element isolation structure; and
   a wiring structure connected to the first source/drain contact and disposed on the first source/drain contact,
   wherein the first source/drain contact includes a first lower contact region that is disposed on the first fin-shaped pattern and the second fin-shaped pattern, a first upper contact region that is disposed one the first lower contact region, and a first dummy contact region, and
   wherein the wiring structure contacts an upper surface of the first upper contact region and is spaced apart from an upper surface of the first dummy contact region.

2. The semiconductor device as claimed in claim 1, wherein no gate electrode is disposed between the first source/drain contact and the element isolation structure.

3. The semiconductor device as claimed in claim 1, further comprising a first gate contact connected to the first gate electrode and disposed on the first gate electrode, the first gate contact not overlapping the first upper contact region or the first dummy contact region in the second direction.

4. The semiconductor device as claimed in claim 3, wherein the first gate electrode is disposed on the second fin-shaped pattern.

5. The semiconductor device as claimed in claim 3, further comprising:
   a second gate electrode disposed on the second fin-shaped pattern and spaced apart from the first gate electrode in the first direction, the first source/drain contact being between the second gate electrode and the element isolation structure; and
   a second gate contact connected to the second gate electrode and disposed on the second gate electrode, the second gate contact not overlapping the first upper contact region and the first dummy contact region in the second direction.

6. The semiconductor device as claimed in claim 5, further comprising a gate isolation structure disposed between the first gate electrode and the second gate electrode, the gate isolation structure not overlapping the first upper contact region or the first dummy contact region in the second direction.

7. The semiconductor device as claimed in claim 1, further comprising:
   a third fin-shaped pattern in contact with the second sidewall of the element isolation structure, the third fin-shaped pattern extending in the second direction;

a fourth fin-shaped pattern in contact with the second sidewall of the element isolation structure, the fourth fin-shaped pattern extending in the second direction and being spaced apart from the third fin-shaped pattern in the first direction; and a second source/drain contact disposed on the third fin-shaped pattern and the fourth fin-shaped pattern, wherein the second source/drain contact includes a second lower contact region that is disposed on the third fin-shaped pattern and the fourth fin-shaped pattern, and a second upper contact region that is disposed on the second lower contact region, an upper surface of the second upper contact region being in contact with the wiring structure.

8. The semiconductor device as claimed in claim 7, wherein the second source/drain contact further includes a second dummy contact region disposed on the second lower contact region, an upper surface of the second dummy contact region not being in contact with the wiring structure.

9. The semiconductor device as claimed in claim 7, wherein the second source/drain contact further includes a third upper contact region disposed on the second lower contact region, an upper surface of the third upper contact region being in contact with the wiring structure.

10. The semiconductor device as claimed in claim 1, further comprising:
a third fin-shaped pattern in contact with the second sidewall of the element isolation structure, the third fin-shaped pattern extending in the second direction;
a fourth fin-shaped pattern in contact with the second sidewall of the element isolation structure, the fourth fin-shaped pattern extending in the second direction and being spaced apart from the third fin-shaped pattern in the first direction;
a second source/drain contact disposed on the third fin-shaped pattern; and
a third source/drain contact disposed on the fourth fin-shaped pattern, the second source/drain contact being spaced apart from the third source/drain contact in the first direction.

11. The semiconductor device as claimed in claim 1, wherein:
the first lower contact region includes a connecting portion between the first upper contact region and the first dummy contact region, a first protruding portion, and a second protruding portion, and
the first upper contact region is disposed between the connecting portion and the first protruding portion, and the first dummy contact region is disposed between the connecting portion and the second protruding portion.

12. The semiconductor device as claimed in claim 1, further comprising a sheet pattern spaced apart from the first fin-shaped pattern and disposed on the first fin-shaped pattern, the first gate electrode wrapping the sheet pattern.

13. A semiconductor device, comprising:
a first fin-shaped pattern extending in a first direction;
a second fin-shaped pattern extending in the first direction and spaced apart from the first fin-shaped pattern in a second direction;
a third fin-shaped pattern extending in the first direction;
a fourth fin-shaped pattern extending in the first direction and spaced apart from the third fin-shaped pattern in the second direction;
an element isolation structure extending in the second direction and in contact with the first fin-shaped pattern and the second fin-shaped pattern;

a first gate electrode extending in the second direction and disposed on the first fin-shaped pattern;
a second gate electrode extending in the second direction and disposed on the third fin-shaped pattern;
a third gate electrode extending in the second direction and disposed on the fourth fin-shaped pattern;
a first source/drain contact disposed on the first fin-shaped pattern and the second fin-shaped pattern and disposed between the first gate electrode and the element isolation structure, the first source/drain contact extending in the second direction;
a second source/drain contact disposed on the third fin-shaped pattern and the fourth fin-shaped pattern, disposed between the second gate electrode and the element isolation structure, and disposed between the third gate electrode and the element isolation structure, the second source/drain contact extending in the second direction; and
a wiring structure disposed on the first source/drain contact and the second source/drain contact, the wiring structure being connected to the first source/drain contact and the second source/drain contact, wherein:
the first source/drain contact includes a first lower contact region disposed on the first fin-shaped pattern and the second fin-shaped pattern, and a first upper contact region disposed on the first lower contact region,
the second source/drain contact includes a second lower contact region disposed on the third fin-shaped pattern and the fourth fin-shaped pattern, and a second upper contact region disposed on the second lower contact region,
the wiring structure includes a via plug in contact with the first upper contact region and the second upper contact region,
a bottom surface of the via plug has a first width,
a width of an upper surface of the first upper contact region is greater than or equal to 1.5 times the first width, and
a width of an upper surface of the second upper contact region is less than or equal to 1.2 times the first width.

14. The semiconductor device as claimed in claim 13, wherein the first source/drain contact includes a first dummy contact region disposed on the first lower contact region.

15. A semiconductor device, comprising:
a first fin-shaped pattern extending in a first direction;
a second fin-shaped pattern spaced apart from the first fin-shaped pattern in a second direction and extending in the first direction;
a third fin-shaped pattern spaced apart from the first fin-shaped pattern in the first direction and extending in the first direction;
a fourth fin-shaped pattern spaced apart from the second fin-shaped pattern in the first direction and extending in the first direction;
a first source/drain contact disposed on the first fin-shaped pattern and the second fin-shaped pattern, and extending in the second direction;
a second source/drain contact disposed on the third fin-shaped pattern, and the fourth fin-shaped pattern and extending in the second direction;
an element isolation structure disposed between the first fin-shaped pattern and the third fin-shaped pattern and disposed between the second fin-shaped pattern and the fourth fin-shaped pattern; and a wiring structure disposed on the first source/drain contact and the second source/drain contact, and connected to the first source/drain contact and the second source/drain contact, wherein:

the first source/drain contact includes a first lower contact region disposed on the first fin-shaped pattern and the second fin-shaped pattern, a first upper contact region disposed on the first lower contact region, and a first dummy contact region, the second source/drain contact includes a second lower contact region disposed on the third fin-shaped pattern and the fourth fin-shaped pattern, and a second upper contact region disposed on the second lower contact region, and the wiring structure is in contact with an upper surface of the first upper contact region and an upper surface of the second upper contact region, and is not in contact with an upper surface of the first dummy contact region.

16. The semiconductor device as claimed in claim 15, wherein the second source/drain contact further includes a second dummy contact region disposed on the second lower contact region, an upper surface of the second dummy contact region not being in contact with the wiring structure.

17. The semiconductor device as claimed in claim 15, further comprising:

a first gate electrode disposed on the first fin-shaped pattern; and a first gate contact disposed on the first gate electrode.

18. The semiconductor device as claimed in claim 17, further comprising:

a second gate electrode disposed on the third fin-shaped pattern;

a third gate electrode disposed on the fourth fin-shaped pattern; and a gate isolation structure disposed between the second gate electrode and the third gate electrode.

19. The semiconductor device as claimed in claim 15, further comprising:

a first source/drain disposed on the first fin-shaped pattern; and a second source/drain disposed on the second fin-shaped pattern, wherein the first source/drain contact is disposed on the first source/drain and the second source/drain, and wherein a bottom surface of the first source/drain is disposed higher than a bottom surface of the element isolation structure.

20. The semiconductor device as claimed in claim 19, wherein the first lower contact region includes a first portion disposed on the first source/drain, a second portion disposed on the second source/drain and a third portion disposed between the first portion and the second portion, and wherein a bottom surface of the third portion is disposed lower than a bottom surface of the first portion and lower than a bottom surface of the second portion.

* * * * *